(12) United States Patent
Amit et al.

(10) Patent No.: US 8,327,050 B2
(45) Date of Patent: Dec. 4, 2012

(54) SYSTEMS AND METHODS FOR COMPRESSING FILES FOR STORAGE AND OPERATION ON COMPRESSED FILES

(75) Inventors: Jonathan Amit, Omer (IL); Noah Amit, Haifa (IL); Nadav Kedem, Tel Aviv (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/108,201

(22) Filed: May 16, 2011

(65) Prior Publication Data

US 2011/0218974 A1    Sep. 8, 2011

Related U.S. Application Data

(63) Continuation-in-part of application No. 12/194,678, filed on Aug. 20, 2008, which is a continuation of application No. 11/258,379, filed on Oct. 26, 2005, now Pat. No. 7,424,482, which is a continuation-in-part of application No. 11/246,544, filed on Oct. 11, 2005, now abandoned, which is a continuation-in-part of application No. PCT/IL2005/000419, filed on Apr. 21, 2005.

(51) Int. Cl.
*G06F 13/12* (2006.01)
(52) U.S. Cl. ....................................... 710/68
(58) Field of Classification Search .............. 710/68; 707/108
See application file for complete search history.

(56) References Cited

U.S. PATENT DOCUMENTS

| | | |
|---|---|---|
| 5,305,295 A | 4/1994 | Chu |
| 5,481,701 A | 1/1996 | Chambers, IV |
| 5,488,365 A | 1/1996 | Seroussi et al. |
| 5,649,151 A | 7/1997 | Chu et al. |
| 5,761,536 A | 6/1998 | Franaszek |
| 5,765,173 A | 6/1998 | Cane et al. |

(Continued)

FOREIGN PATENT DOCUMENTS

EP    0798656 E2    10/1997

(Continued)

OTHER PUBLICATIONS

I.C. Tuduce et al., Adaptive Main Memory Compression, Apr. 15, 2005, Internet Article.

(Continued)

*Primary Examiner* — Henry Tsai
*Assistant Examiner* — Juanito Borromeo
(74) *Attorney, Agent, or Firm* — Griffiths & Seaton PLLC

(57) ABSTRACT

Methods and systems for creating, reading, and writing compressed files in a computer system comprising a file system coupled with storage medium and at least one application program interface (API) configured to communicate with the file system by means of file access-related requests are provided. The file access-related requests are intercepted in order to provide at least one of the following: a) to derive and compress data corresponding to the intercepted file access request and to facilitate storing the compressed data at the storage medium as a compressed file; b) to facilitate restoring at least part of compressed data corresponding to the intercepted file request and communicating the resulting data through the API. The compressed files comprise plurality of compressed units. One or more corresponding compressed units may be read and/or updated with no need of restoring the entire file while maintaining de-fragmented structure of the compressed file.

28 Claims, 14 Drawing Sheets

U.S. PATENT DOCUMENTS

| | | | |
|---|---|---|---|
| 5,774,715 | A | 6/1998 | Madany et al. |
| 5,778,411 | A | 7/1998 | DeMoss et al. |
| 5,809,295 | A | 9/1998 | Straub et al. |
| 5,813,011 | A | 9/1998 | Yoshida et al. |
| 5,813,017 | A | 9/1998 | Morris |
| 5,991,753 | A | 11/1999 | Wilde |
| 6,092,071 | A | 7/2000 | Bolan et al. |
| 6,112,024 | A | 8/2000 | Almond et al. |
| 6,115,787 | A | 9/2000 | Obara |
| 6,145,069 | A | 11/2000 | Dye |
| 6,349,375 | B1 | 2/2002 | Faulkner et al. |
| 6,532,121 | B1 | 3/2003 | Rust et al. |
| 6,577,734 | B1 | 6/2003 | Etzel et al. |
| 6,584,520 | B1 | 6/2003 | Cowart et al. |
| 6,678,828 | B1 | 1/2004 | Pham et al. |
| 7,484,245 | B1 | 1/2009 | Friedman et al. |
| 2002/0035660 | A1 | 3/2002 | Tikkanen et al. |
| 2002/0056010 | A1 | 5/2002 | Lincoln et al. |
| 2002/0097172 | A1 | 7/2002 | Fallon |
| 2002/0107988 | A1 | 8/2002 | Jordan |
| 2002/0143792 | A1 | 10/2002 | Belu |
| 2003/0084238 | A1 | 5/2003 | Okada et al. |
| 2004/0030813 | A1 | 2/2004 | Benveniste et al. |
| 2004/0064588 | A1 | 4/2004 | Jungck |
| 2004/0255048 | A1 | 12/2004 | Lev Ran et al. |
| 2005/0021657 | A1 | 1/2005 | Negishi et al. |
| 2005/0033988 | A1 | 2/2005 | Chandrashekhar et al. |
| 2005/0125384 | A1 | 6/2005 | Gilfix et al. |
| 2006/0015535 | A1 | 1/2006 | Buchsbaum et al. |
| 2007/0208893 | A1* | 9/2007 | Azzarello et al. ............... 710/68 |

FOREIGN PATENT DOCUMENTS

| | | |
|---|---|---|
| WO | 95/18997 A2 | 7/1995 |
| WO | 95/29437 A1 | 11/1995 |
| WO | 01/47243 A1 | 6/2001 |

OTHER PUBLICATIONS

P.R. Wilson et al., "Dynamic Storage Allocation: A Survey and Critical Review," 1995, Internet Article.

M.D. Flouris et al., "Violin: A Framework for Extensible Block-level Storage," Apr. 2005, Internet Article.

B. Praveen et al., "Design and Implementation of a File System with on-the-fly Data Compression for GNU/Linux," Feb. 2000, Internet Article.

P.T. Breuer et al., "The Network Block Device," Dec. 1999, Internet Article.

R. Dykhuis, "Compression with Stacker and DoubleSpace," Computers in Libraries, vol. 13, No. 5, pp. 27-29, May 1993, XP-000671468.

T.R. Halfhill, "How Safe is Data Compression?" BYTE.com Online, Feb. 1994, XP-002419411.

Anon, "How NTFS Works," Mar. 28, 2003, Internet Article, XP-002419412.

T. Kawashima et al., "A Universal Compressed Data Format for Foreign File Systems," IEEE, p. 429, 1995.

Z.M. Yusof et al., "Compressed Memory Core," pp. 50-52, Electronic Systems and Control Division Research, 2003, Internet Article.

Storewiz, "A new approach to data compression," 2007, Internet Article, XP-002419413.

A. Shacham et al., "IP Payload Compression Protocol (IPComp)," RFC 3173, Sep. 2001.

EMC White Paper, "Leveraging Networked Storage for Your Business," 2003.

Ziv et al., "A Universal Algorithm for Sequential Data Compression," IEEE Transactions on Information Theory, vol. IT-23, No. 3, pp. 337-343, 1977.

Kampf, "Peformance as a Function of Compression," IBM Systems Journal, vol. 42, No. 6, pp. 1-2, 1998.

Pajarola et al., "An Image Compression Method for Spatial Search," IEEE, pp. 358, 359 and 364, 2000.

Wee-Keong NG wet al., "Block-Oriented Compression Techniques for Large Statistical Databases," IEEE Transactoins on Knowledge and Data Entry, vol. 9, No. 2, pp. 314-328, 1997.

Gzip, "Gunzip, Gzcat, Gzip." MKSSoftware.com Feb. 2, 2003. Web. Dec. 30, 2009, http://web.archive.org/web/20030202222551/http://www.mkssoftware.com/docs/man1/gzip.1.asp.

Dave Marshall, "File Access and Directory System Calls," http://www.cs.cf.ac.uk/Dave/C/node20.html, Jan. 1999.

* cited by examiner

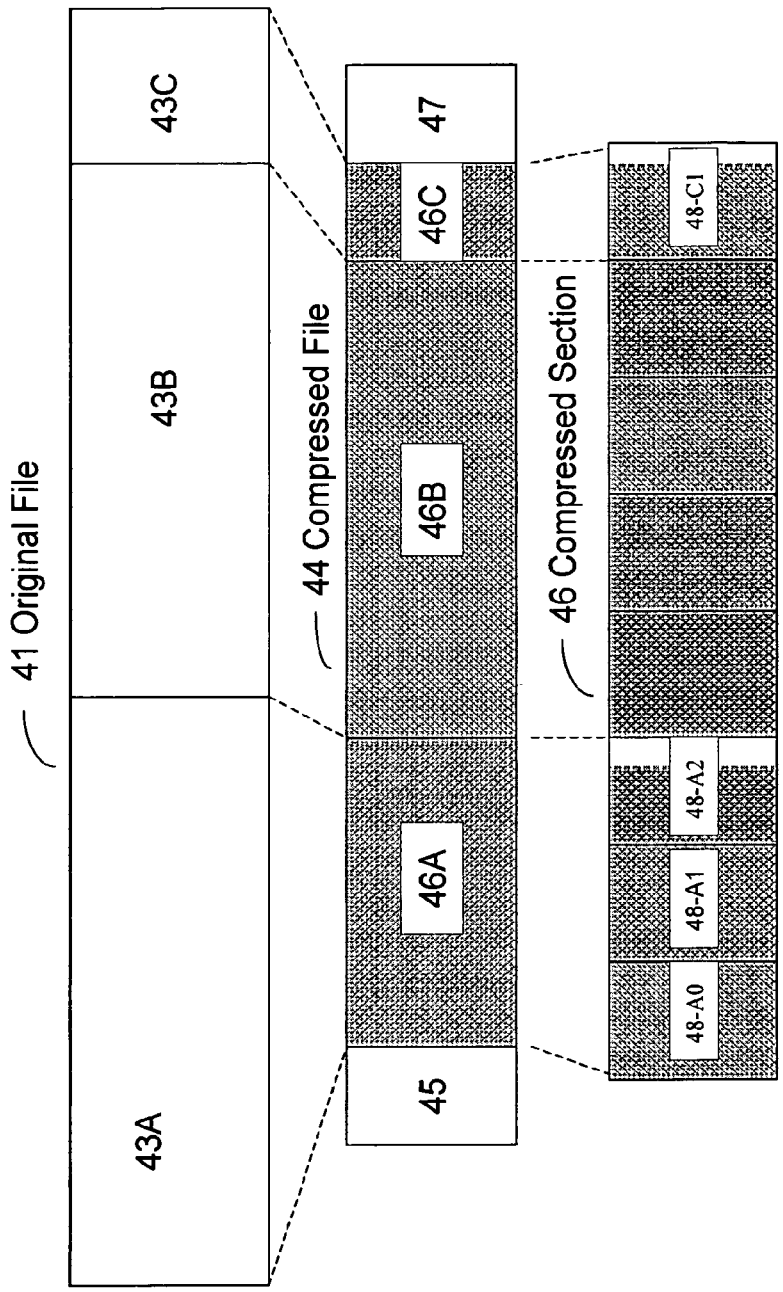

Exemlary File (50)
+-------+-------+-------+-------+
| Cluster#A (1Mb)| Cluster#B (1Mb)| Cluster#C (1Mb)| Cluster#D (413Kb) |
+-------+-------+-------+-------+

Cluster#A

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|C (1bit)| Compressed Section Length (31 bit)                   |
+-+-+-+-+-+-+-+-+-+-+-+-+-+-+-+-+-+-+-+-+-+-+-+-+-+-+-+-+-+-+-+-+
!Entry #1; CLU#1 (4 bytes for physical location pointer)!
+-+-+-+-+-+-+-+-+-+-+-+-+-+-+-+-+-+-+-+-+-+-+-+-+-+-+-+-+-+-+-+-+
! Entry #2, CLU#2(4 bytes for physical location pointer)!
+-+-+-+-+-+-+-+-+-+-+-+-+-+-+-+-+-+-+-+-+-+-+-+-+-+-+-+-+-+-+-+-+
!Entry =3; CLU#3 (4 bytes for physical location pointer)!
+-+-+-+-+-+-+-+-+-+-+-+-+-+-+-+-+-+-+-+-+-+-+-+-+-+-+-+-+-+-+-+-+
! Entry = 4; CLU#4 (4 bytes for physical location pointer) !
+-+-+-+-+-+-+-+-+-+-+-+-+-+-+-+-+-+-+-+-+-+-+-+-+-+-+-+-+-+-+-+-+
!Entry #5; CLU#5 (4 bytes for physical location pointer)!
+-+-+-+-+-+-+-+-+-+-+-+-+-+-+-+-+-+-+-+-+-+-+-+-+-+-+-+-+-+-+-+-+
!Entry#6; void CLU# -1 (4 bytes for physical location pointer)!
+-+-+-+-+-+-+-+-+-+-+-+-+-+-+-+-+-+-+-+-+-+-+-+-+-+-+-+-+-+-+-+-+

!Entry#17 void CLU# -1 (4 bytes for physical location pointer)!
+-+-+-+-+-+-+-+-+-+-+-+-+-+-+-+-+-+-+-+-+-+-+-+-+-+-+-+-+-+-+-+-+
```

Figure 5

SYSTEMS AND METHODS FOR COMPRESSING FILES FOR STORAGE AND OPERATION ON COMPRESSED FILES

CROSS REFERENCE TO RELATED APPLICATIONS

The present application is a Continuation-In-Part of U.S. application Ser. No. 12/194,678, filed on Aug. 20, 2008, which is a Continuation of U.S. Pat. No. 7,424,482, filed on Oct. 26, 2005, which is a Continuation-In-Part of U.S. application Ser. No. 11/246,544 (abandoned), filed on Oct. 11, 2005, which is a Continuation-In-Part of International Application No. PCT/IL2005/000419, filed on Apr. 21, 2005, which claims priority of U.S. Provisional Application No. 60/565,298, filed on Apr. 26, 2004, the entire contents of each application being incorporated herein by reference.

FIELD OF THE INVENTION

This invention relates to computing systems and, in particular, to a method and apparatus facilitating compression and operation on file system with compressed data over file systems protocols.

BACKGROUND OF THE INVENTION

In current business environment, all types of business data are becoming more and more critical to business success. The tremendous growth and complexity of business-generated data is driving the demand for information storage, defining the way of sharing, managing and protection of information assets.

Typically, no single technology or architecture is able to address all needs of any organization. Main storage technologies are described, for example, in the White Paper by EMC, "Leveraging Networked storage for your business," March 2003, USA and basically can be identified by location and connection type (intra-computer storage, direct attached storage (DAS), IP, channel networks, etc.) and by the method that data is accessed. There are three basic types of storage architectures to consider in connection with methods of data access: Block Access, File Access, and Object Access.

In block access architecture, the communication between a server/client and a storage medium occurs in terms of blocks; information is pulled block by block directly of the disk. The operation system keeps track of where each piece of information is on the disk, while the storage medium is usually not aware of the file system used to organize the data on the device. When something needs to get read or be written, the data are directly accessed of the disk by that processor which knows where each block of data is located on the disk and how to put them together. The examples of block access storage technologies are DAS (Direct Attached Storage), SAN (Storage Area Network), Block Storage over IP (e.g. FCIP, iFCP, iSCSI, etc.), intra-memory storage, etc.

File access requires the server or client to request a file by name, not by physical location. As a result, a storage medium (external storage device or storage unit within computer) is usually responsible to map files back to blocks of data for creating, maintaining and updating the file system, while the block access is handled "behind the scene." The examples of file access storage technologies are NAS (Network Attached Storage with NFS, CIFS, HTTP, etc. protocols), MPFS (Multi-Pass File Serving), intra-computer file storage, etc. The file access storage may be implemented, for example, for general-purpose files, web applications, engineering applications (e.g. CAD, CAM, software development, etc.), imaging and 3D data processing, multi-media streaming, etc.

Object access further simplifies data access by hiding all the details about block, file and storage topology from the application. The object access occurs over API integrated in content management application. The example of object access storage technology is CAS (Content Addressed Storage).

More efficient use of storage may be achieved by data compression before it is stored. Data compression techniques are used to reduce the amount of data to be stored or transmitted in order to reduce the storage capacity and transmission time respectively. The compression may be achieved by using different compression algorithms, for instance, a standard compression algorithm, such as that described by J. Ziv and A. Lempel, "A Universal Algorithm For Sequential Data Compression," IEEE Transactions on Information Theory, IT-23, pp. 337-343 (1997). It is important to perform compression transparently, meaning that the data can be used with no changes to existing applications. In either case, it is necessary to provide a corresponding decompression technique to enable the original data to be reconstructed and accessible to applications. When an update is made to a compressed data, it is generally not efficient to decompress and recompress the entire block or file, particularly when the update is to a relatively small part of data.

Various implementations of optimization of storage and access to the stored data are disclosed for example in the following patent publications:

U.S. Pat. No. 5,761,536 (Franaszek) discloses a system and method for storing variable length objects such that memory fragmentation is reduced, while avoiding the need for memory reorganization. A remainder of a variable length object may be assigned to share a fixed-size block of storage with a remainder from another variable length object (two such remainders which share a block are referred to as roommates) on a best fit or first fit basis. One remainder is stored at one end of the block, while the other remainder is stored at the other end of the block. The variable length objects which are to share a block of storage are selected from the same cohort. Thus, there is some association between the objects. This association may be that the objects are from the same page or are in some linear order spanning multiple pages, as examples. Information regarding the variable length objects of a cohort, such as whether an object has a roommate, is stored in memory.

U.S. Pat. No. 5,813,011 (Yoshida et al.) discloses a method and apparatus for storing compressed data, wherein compressed file consists of: a header that carries information showing the position of a compression management table; compressed codes; and the compression management table that holds information showing the storage location of the compressed code of each original record.

U.S. Pat. No. 5,813,017 (Morris et al.) discloses a method and means for reducing the storage requirement in the backup subsystem and further reducing the load on the transmission bandwidth where base files are maintained on the server in a segmented compressed format. When a file is modified on the client, the file is transmitted to the server and compared with the segmented compressed base version of the file utilizing a differencing function but without decompressing the entire base file. A delta file which is the difference between the compressed base file and the modified version of the file is created and stored on a storage medium which is part of the backup subsystem.

U.S. Pat. No. 6,092,071 (Bolan et al.) discloses a system for control of compression and decompression of data based upon system aging parameters, such that compressed data becomes a system managed resource with a distinct place in the system storage hierarchy. Processor registers are backed by cache, which is backed by main storage, which is backed by decompressed disk storage, which is backed by compressed disk storage then tape, and so forth. Data is moved from decompressed to compressed form and migrated through the storage hierarchy under system control according to a data life cycle based on system aging parameters or, optionally, on demand: data is initially created and stored; the data is compressed at a later time under system control; when the data is accessed, it is decompressed on demand by segment; at some later time, the data is again compressed under system control until next reference. Large data objects are segmented and compression is applied to more infrequently used data.

U.S. Pat. No. 6,115,787 (Obara et al.) discloses a disk storage system, wherein data to be stored in the cache memory is divided into plural data blocks, each having two cache blocks in association with track blocks to which the data belongs and are compressed, thus providing the storage of plural compressed records into a cache memory of a disk storage system in an easy-to-read manner. The respective data blocks after the compression are stored in one or plural cache blocks. Information for retrieving each cache block from an in-track address for the data block is stored as part of retrieval information for the cache memory. When the respective data blocks in a record are read, the cache block storing the compressed data block is determined based on the in-track address of the data block and the retrieval information.

U.S. Pat. No. 6,349,375 (Faulkner et al.) discloses a combination of data compression and decompression with a virtual memory system. A number of computer systems are discussed, including so-called embedded systems, in which data is stored in a storage device in a compressed format. In response to a request for data by a central processing unit (CPU), the virtual memory system will first determine if the requested data is present in the portion of main memory that is accessible to the CPU, which also happens to be where decompressed data is stored. If the requested data is not present in the decompressed portion of main memory, but rather is present in a compressed format in the storage device, the data will be transferred into the decompressed portion of main memory through a demand paging operation. During the demand paging operation, the compressed data will be decompressed. Likewise, if data is paged out of the decompressed portion of main memory, and that data must be saved, it can also be compressed before storage in the storage device for compressed data.

U.S. Pat. No. 6,584,520 (Cowart et al.) discloses a method of storage and retrieval of compressed files. The method involves dynamically generating file allocation table to retrieve compressed file directly from compact disk read only memory.

U.S. Pat. No. 6,678,828 (Pham et al.) discloses a secure network file access appliance supporting the secure access and transfer of data between the file system of a client computer system and a network data store. An agent provided on the client computer system and monitored by the secure network file access appliance ensures authentication of the client computer system with respect to file system requests issued to the network data store. The secure network file access appliance is provided in the network infrastructure between the client computer system and network data store to apply qualifying access policies and selectively pass through to file system requests. The secure network file access appliance maintains an encryption key store and associates encryption keys with corresponding file system files to encrypt and decrypt file data as transferred to and read from the network data store through the secure network file access appliance.

U.S. Patent Application Publication No. 2004/030,813 (Benveniste et al.) discloses a method and system of storing information, includes storing main memory compressed information onto a memory compressed disk, where pages are stored and retrieved individually, without decompressing the main memory compressed information.

U.S. Patent Application Publication No. 2005/021,657 (Negishi et al.) discloses a front-end server for temporarily holding an operation request for a NAS server, which is sent from a predetermined client, is interposed between the NAS server and clients on a network. This front-end server holds information concerning a correlation among data files stored in the NAS server, optimizes the operation request received from the client based on the information, and transmits the operation request to the NAS server.

SUMMARY OF THE INVENTION

There is a need in the art to provide for a new system and method of compressed storage for use with file access storage with no derogating of storing and retrieving capabilities and with no need of a user's awareness of compression/decompression operations as well as the storage location of the compressed data. The invention, in some of its aspects, is aimed to provide a novel solution capable of facilitating random access to data in compressed stored files and, thus, enabling operations on the compressed data with no need for decompression of entire files.

In accordance with certain aspects of the present invention, there is provided a method and system for creating, reading and writing compressed files for use with computing system comprising a file system coupled with a storage medium and at least one application program interface (API) configured to communicate with the file system by means of file access-related requests; said method and system facilitating direct access to the compressed data whilst maintaining de-fragmentation of the compressed file.

In accordance with certain aspects of the present invention, there is provided a method for storing a compressed file in a computer system comprising a file system coupled with a storage medium and at least one application program interface (API) configured to communicate with the file system by means of file access-related requests. The method comprising intercepting at least one of said file access-related requests generated via the API, and providing at least one of the following with respect to said intercepted request:

a) deriving and compressing data corresponding to the intercepted file access-related request and facilitating communication with the file system for storing the compressed data at the storage medium as at least one compressed file;

b) facilitating restoring at least part of compressed data corresponding to the intercepted file access-related request and communicating the resulting data through the API.

The file access-related requests may be, for example, "create file," "read file," "write file," "open file," etc.

In accordance with further aspects of the present invention, compressing the derived data corresponding to the intercepted "create file" request comprises sequentially processing at least one fixed-size portion of said derived data (cluster) into corresponding compressed section divided into at least one fixed-size compression logical units (CLU), said compressing giving rise to the compressed file containing compressed sections corresponding to said clusters and a header comprising unique file descriptor; the method further comprising creating a section table with at least one record describing a compressed section, said record holding at least information on CLUs corresponding to the compressed section and storage location pointers pertaining to said CLUs.

In accordance with further aspects of the present invention, reading a file stored as compressed data packed into one or more compressed sections corresponding to fixed-size portions of data (clusters) of the raw file, said compressed sections divided into fixed-size compression logical units (CLU), comprises:

a) determining a serial number of first compressed section comprising data to be read;

b) determining the CLUs corresponding to said compressed section and storage location thereof by referring to the section table;

c) facilitating restoring the cluster from said compressed section.

d) repeating the stages b) and c) for compressed sections with serial numbers incremented by 1 if the range of data to be read exceeds the size of the restored clusters, until all data to be read are restored.

In accordance with further aspects of the present invention, writing data at a given data range to a file stored as compressed data packed into one or more compressed sections corresponding to fixed-size portions of data (clusters) from the raw file, said compressed sections divided into fixed-size compression logical units (CLU), comprises:

a) determining a serial number of first compressed section comprising data to be updated constituting the original compressed section;

b) determining the storage location of the compressed data to be updated by referring to a section table which holds information on CLUs corresponding to said compressed section and storage location thereof;

c) facilitating restoring the cluster from said original compressed section;

d) calculating the offset of updating data within said cluster and facilitating the update of the given data range;

e) compressing the updated cluster into an updated compressed section;

f) facilitating overwriting of said original compressed section with updated compressed section;

g) updating the section table;

h) repeating stages b) to g) for compressed sections with serial numbers incremented by 1 if the range of data to be write exceeds the size of the restored clusters, until all required data are written.

In accordance with further aspects of the present invention the method comprises handling a list of free CLUs released during writing data to the compressed file, said list is handling during all sessions related to the file until the file is closed. The method further comprising comparing the numbers of CLUs required to said original $N_o$ and updated $N_u$ compressed section and facilitating one of the following:

a) overwriting all CLUs corresponding to the original compressed section with CLUs corresponding to the updated compressed section if $N_o=N_u$;

b) overwriting first $N_u$ CLUs corresponding to the original compressed section with CLUs corresponding to the updated compressed section and updating the list of free CLUs about released CLUs if $N_o>N_u$;

c) overwriting all CLUs corresponding to the original compressed section with CLUs corresponding to the updated compressed section and writing the rest of CLUs corresponding to the updated compressed section to the CLUs contained in the list of free CLUs, if $N_o<N_u<N_o+N_f$ where $N_f$ is a number of CLUs in said list;

d) overwriting all CLUs corresponding to the original compressed section with CLUs corresponding to the updated compressed section, writing the CLUs corresponding to the updated compressed section to the CLUs contained in the list of free CLUs, and continuous writing the rest of CLUs corresponding to the updated compressed section to next free storage location if $N_o+N_f \leqslant N_u$.

In accordance with further aspects of the present invention the method further comprises checking the list of free CLUs before closing the file and, if not empty, a) defining a CLU with the highest storage location pointer among CLUs comprised in the compressed sections (first CLU);

b) facilitating moving the compressed data from said first CLU to a free CLU with lower storage location pointer (second CLU);

c) assigning said second CLU to pertaining compressed section and said first CLU to the list of free CLUs;

d) repeating the stages b)-d) until the storage location pointers of all CLUs comprised in compressed sections are lower than a pointer of any of CLU comprising in the list of free CLUs;

In accordance with certain aspects of the present invention, there is provided a computer system configured for operating with compressed files and comprising:

a) a file system coupled to a storage medium and to at least one application program interface (API) configured to communicate with the file system by means of file access-related requests;

b) a subsystem for intercepting at least one of said file access-related requests generated via the API;

c) a compression subsystem configured to provide at least one of the following with respect to said intercepted request:

i) deriving and compressing data corresponding to the intercepted file access request and facilitating communicating with the file system for storing the compressed data at the storage medium as a at least one compressed file;

ii) facilitating restoring at least part of compressed data corresponding to the intercepted file-access-related request and communicating the resulting data through the API.

It is to be understood that the system according to the invention may be a suitably programmed computer. Likewise, the invention contemplates a computer program being readable by a computer for executing the method of the invention. The invention further contemplates a machine-readable memory, tangibly embodying a program of instructions executable by the machine for executing the method of the invention.

BRIEF DESCRIPTION OF THE DRAWINGS

In order to understand the invention and to see how it may be carried out in practice, a preferred embodiment will now be described, by way of non-limiting example only, with reference to the accompanying drawings, in which:

FIG. 4 is a schematic diagram of raw and compressed files in accordance with certain embodiments of the present invention.

FIG. 5 is an exemplary structure of section table in accordance with certain embodiments of the present invention.

DETAILED DESCRIPTION OF THE INVENTION

Figure 1:
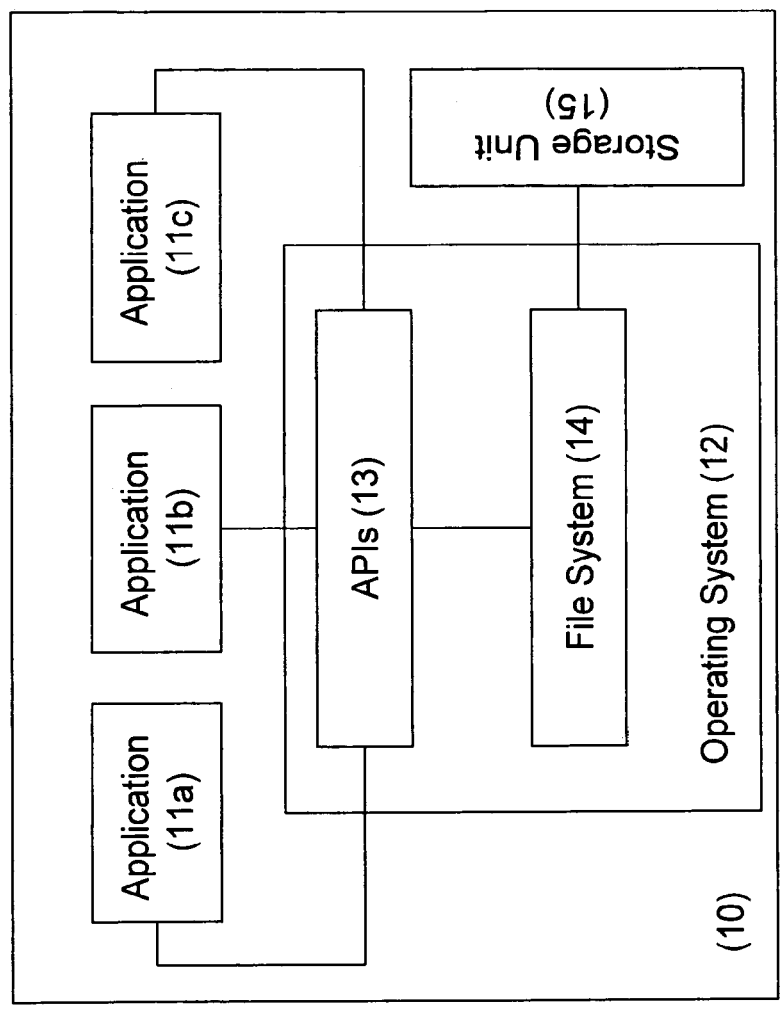
FIG. 1 is a schematic block diagram of typical computer architecture as known in the art.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. In the drawings and descriptions, identical reference numerals indicate those components that are common to different embodiments or configurations.

Unless specifically stated otherwise, as apparent from the following discussions, it is appreciated that throughout the specification discussions, utilizing terms such as, "processing," "computing," "calculating," "determining," or the like, refer to the action and/or processes of a computer or computing system, or processor or similar electronic computing device, that manipulate and/or transform data represented as physical, such as electronic, quantities within the computing system's registers and/or memories into other data, similarly represented as physical quantities within the computing system's memories, registers or other such information storage, transmission or display devices.

Embodiments of the present invention may use terms such as processor, computer, apparatus, system, sub-system, module, unit, device (in single or plural form) for performing the operations herein. This may be specially constructed for the desired purposes, or it may comprise a general purpose computer selectively activated or reconfigured by a computer program stored in the computer. Such a computer program may be stored in a computer readable storage medium. Throughout the following description the term "storage" will be used for any storage medium such as, but not limited to, any type of disk including, optical disks, CD-ROMs, magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a computer system bus.

The processes/devices (or counterpart terms specified above) and displays presented herein are not inherently related to any particular computer or other apparatus, unless specifically stated otherwise. Various general purpose systems may be used with programs in accordance with the teachings herein, or it may prove convenient to construct a more specialized apparatus to perform the desired method. The desired structure for a variety of these systems will appear in the description below. In addition, embodiments of the present invention are not described with reference to any particular programming language. It will be appreciated that a variety of programming languages may be used to implement the teachings of the inventions as described herein.

Bearing this in mind, attention is drawn to FIG. 1 illustrating a schematic diagram of typical computer architecture as known in the art.

Applications 11a, 11b, 11c (e.g. Oracle DB, ERP, CRM, Microsoft Office, etc.) run on a computing system 10. In order to use specific data or functions of the operating system 12 or another program, the applications make contact with the operating system via application programming interfaces (APIs) 13. In order to facilitate input/output (I/O) operations to the files (e.g. create, read, write, etc.), the APIs call to a file system 14 coupled to a storage unit 15. The computing system may include several computer platforms and the above elements may be distributed in between one or more platforms. The term "operating system" used in this patent specification should be expansively construed to cover any collection of system programs that control the overall operation of a computer system. The term "file system" used in this patent specification should be expansively construed to cover any system managing I/O operations to files and controlling files location on a storage unit. The file system may be a part of the operating system, external to the operating system, distributed, virtual, etc. The storage unit may be located internally or/and externally in respect to a platform accommodating operating system and/or file system.

Figure 2A:
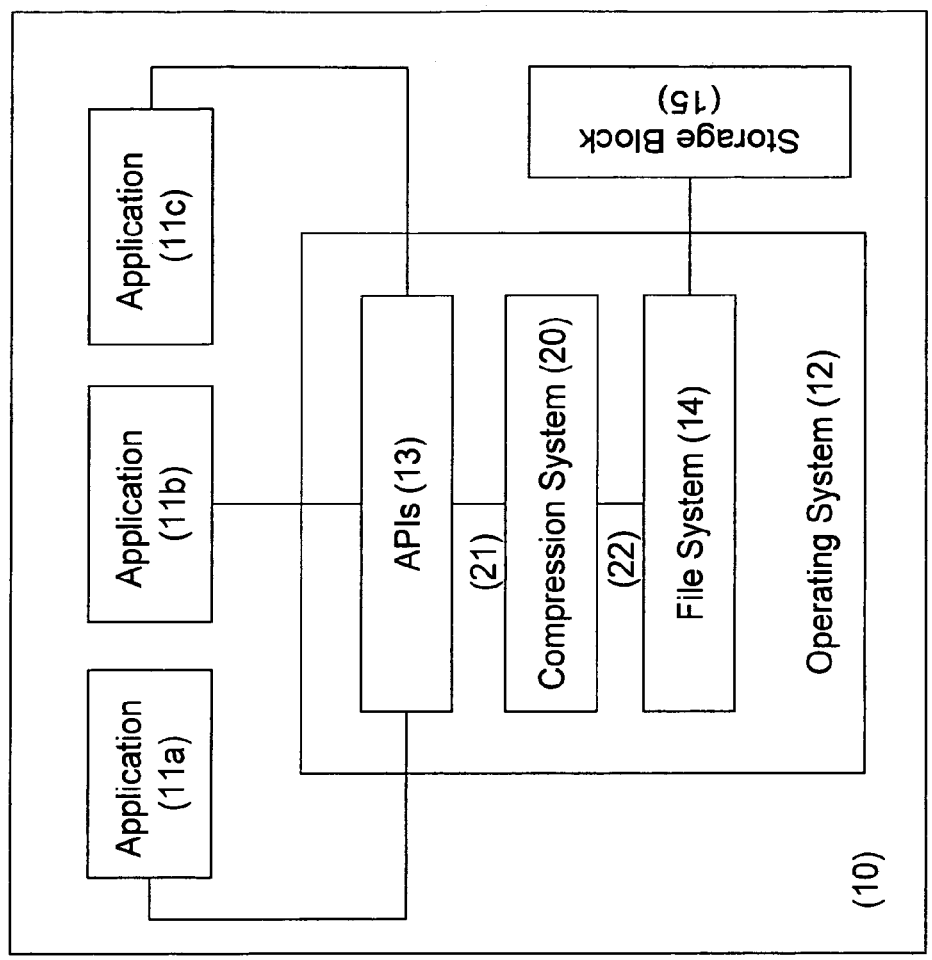
FIGS. 2a), 2b) and 2c) are schematic block diagrams of storage architecture in accordance with certain embodiments of the present invention.
Figure 2B:
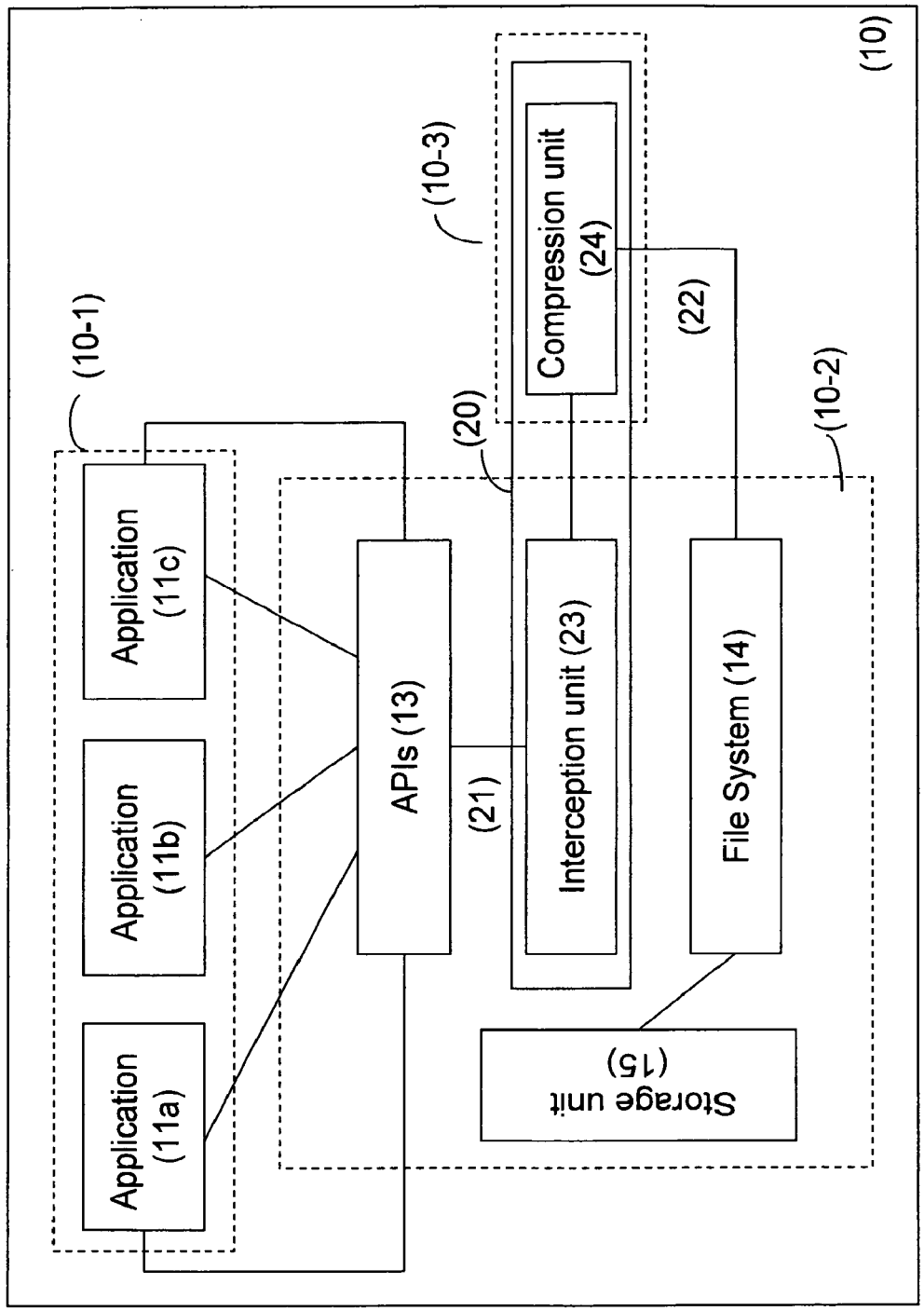
Figure 2C:
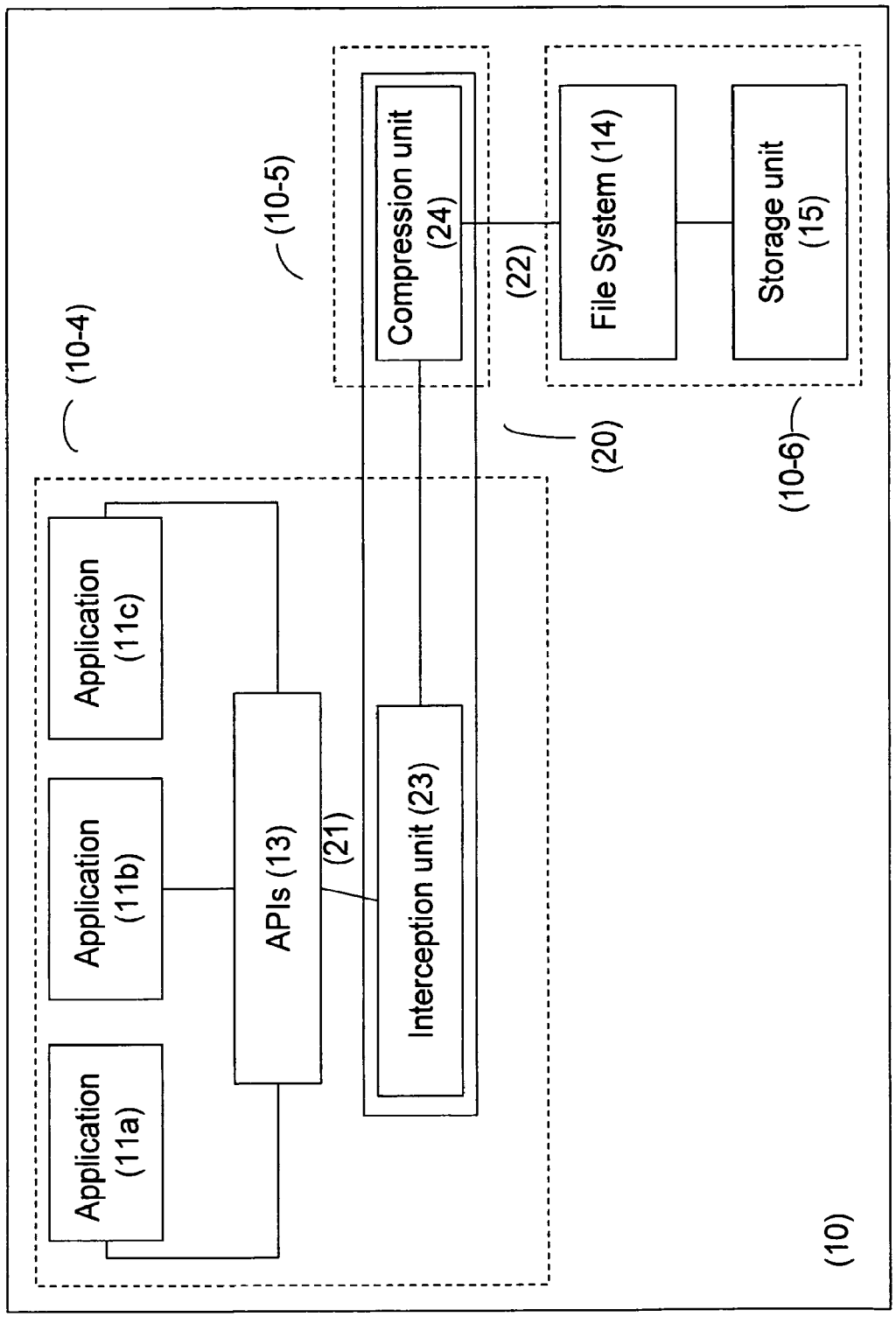

Referring to FIGS. 2a-2c, there are illustrated schematic diagrams of storage architecture in accordance with certain embodiments of the present invention. A compression system 20 is coupled to one or more APIs by an interface 21 and to the file system by an interface 22. The compression system comprises an intercept routine and is configured to intercept communication between APIs and the file system and to redirect file call operations (file access-related requests) to the intercept routine. The interface 21 between the compression system and an API is capable of emulating the file system, while the interface 22 between the compression system and the file system is capable of emulating respective API.

The compression system 20 is capable of deriving and compressing data corresponding to the intercepted file access-related request, facilitating communication with the file system for storing the compressed data at the storage medium as at least one compressed file and/or facilitating restoring at least part of compressed data corresponding to the intercepted file request and communicating the resulting data through the API. The operations on the compressed files in accordance with certain embodiments of the present invention will be further described with reference to FIGS. 3-9 below.

As illustrated in FIG. 2a, by way of non-limiting example, the file system, the operation system, the applications, the operating system with APIs, the storage unit and the compression system are accommodated within one computer platform. The compression system may be implemented internally, partly internally/partly externally or externally to the system kernel.

FIG. 2b illustrates, by way of non-limiting example, other embodiment of the present invention when the computer system comprises several platforms 10-1, 10-2, 10-3 illustrated by dashed squares. The compression system 20 comprises an interception unit 23 and a compression unit 24. The interception unit 23 is accommodated within the same platform 10-2 as the operating system (not illustrated) with APIs 13, the file system 14 and the storage unit 15, while the compression unit 24 is accommodated within separate platform 10-3.

FIG. 2c illustrates, by way of non-limiting example, other embodiment of the present invention when the interception unit 23 is accommodated within a platform 10-4 together with the operating system (not illustrated) with APIs 13; the file system 14 and the storage unit 15 are accommodated within the platform 10-6 (e.g. located at NAS storage server) and the compression unit 24 is accommodated within the platform 10-5.

The compression system may support any physical interfaces and may preserve the storage unit features such as, for example, redundancy, mirroring, snapshots, failover, rollback, management, etc. For implementing the compression and access functions described below, typically, the compression system does not require changes in any level above the file itself. A user need not be aware of the compression and decompression operations and the storage location of compressed data.

During "write" operation on the files to be compressed before storage, the files from applications (11a, 11b, etc.) flow through the respective APIs, intercepted by the compression system 20, compressed and moved to the storage unit 15 via the file system 14. Files containing different kinds of data (e.g. text, image, voice, etc.) may be compressed by different compression algorithms. A "read" operation proceeds in reverse direction; the required files are retrieved by the compression system via the file system, decompressed (partly or entirely, in accordance with required data range) and sent to the appropriate API.

In accordance with certain embodiments, the compression system 20 may provide also security functions as, for example, encryption, authorization, etc.

The compression system 20 is configured to transfer selected file access-related requests (typically, control related transactions, e.g. copy file, delete file, rename file, take a snapshot, etc.) between the API and the file system in a transparent manner, while intervening in data related transactions (e.g. open, close, read, write, create, etc.) and some control related transactions as, for example, directory list command.

In certain embodiments of the invention the compression system may be configured to compress also uncompressed files stored in the storage unit 15. The compression system may extract all or selected files from the storage unit in accordance with pre-defined criteria, compress them in accordance with present invention and re-write in the storage unit in a compressed form.

In certain embodiments of the invention the compression system 20 may also be configured to compress only selected passing files in accordance with pre-defined criteria (e.g. size, directory, file type).

The raw file (or its relevant part) is compressed by the compression system 20 during or before writing to the storage unit 15. Similarly, the file (or its relevant part) is decompressed by the compression system 20 during or after reading from the storage unit 15.

Note that the invention is not bound by the specific architecture described with reference to FIGS. 1 and 2. Those versed in the art will readily appreciate that the invention is, likewise, applicable to any computing system, including client/server systems, distributed (including LAN and WAN based) computer systems or other computing systems comprising any form of operating and file systems. The compression functions of the compression system 20 (or part of them) may be accommodated within the same computer platform together with interception functions (as illustrated in FIG. 2a), at a separate computer platform (as illustrated in FIGS. 2b and 2c), distributed between several platforms and/or integrated within different computer platforms with different functions (e.g. storage servers, enterprise switches, etc.).

Figure 3:
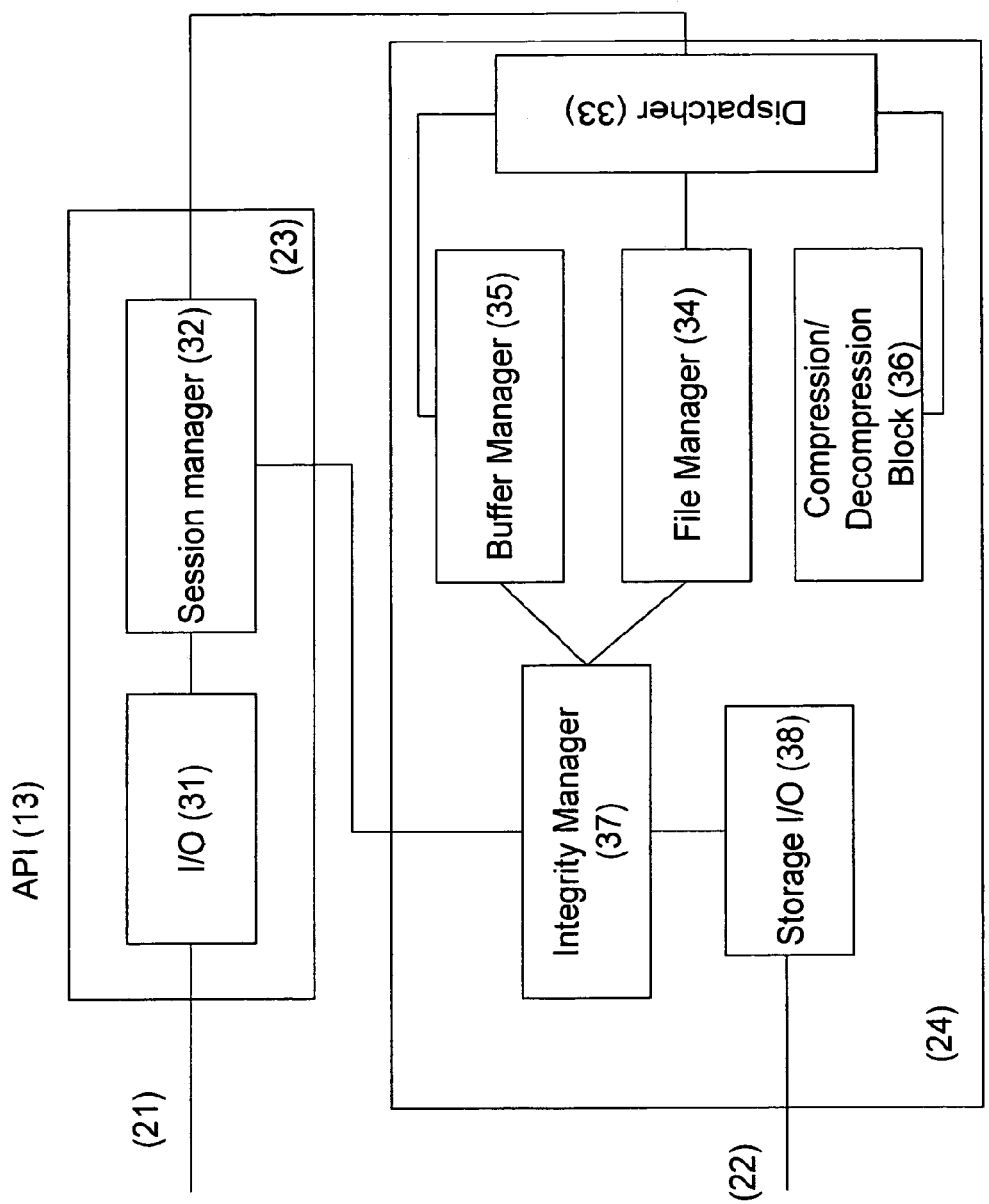
FIG. 3 is a schematic block diagram of the system functional architecture in accordance with certain embodiments of the present invention.

FIG. 3 illustrates a schematic functional block diagram of the compression system 20 in accordance with certain embodiments of the present invention.

As was illustrated with reference to FIGS. 2b) and 2c), the compression system comprises the interception unit 23 and the compression unit 24. The interception unit 23 comprises an Input/Output (I/O) block 31 coupled with a session manager 32. The I/O block facilitates interfacing between the compression system and an API via the interface 21 and is capable of emulating the file system. The I/O block also receives data from the session manager and inserts them into a relevant emulation process while replacing queues provided by the operating system and/or the file system by queues generated by the compression unit 23. The I/O block is capable of deriving data and metadata from the API during the interception process. The I/O block 31 is also capable of transforming the data received by the compression system 20 from the file system 14 into the metadata and providing them to the API. The meta-data include application code (e.g. Open, Read, Write, etc.), application parameters corresponding to the application code (e.g. file name) and data stream parameters (e.g. data length, data address, etc.). The I/O block forwards the received data accompanying with corresponding metadata to the session manager 32.

Session starts by "Open File" request and ends by "Close File" request received from the same session. The session manager 32 holds all the session's private data as, for example, source session address, all files instance in use, session counters, session status, all instances for the buffers in use, etc. The session manager also handles the "File Block" and releases all the relevant resources on disconnect.

The compression unit 24 comprises a dispatcher 33 coupled to a file manager 34, buffer manager 35 and compression/decompression block 36. The dispatcher is coupled to the session manager 32.

The session manager 32 loads session tasks to the dispatcher 33 for sorting and sending the received data in accordance with the corresponding metadata. The dispatcher is responsible for the sharing of any file operation. It is also responsible for the integrity of the files and for flushing the memory to disk. The dispatcher 33 requests the file manger 34 for data related transactions (e.g. Open, Read, Write, Close, etc.) and the compression/decompression block 36 for compression/decompression operations in accordance with certain embodiments with the present invention. Generally, compression algorithms have several compression levels characterized by trade-off between compression efficiency and performance parameters. The compression block 36 may select the optimal compression level and adjust the compression ratio to number of sockets currently handling by input/output block 31 (and/or CPU utilization). The information on the selected compression level is kept in the compression portion of data. The file manager 34 is responsible for the integrity and operations on a file. It also combines all requests related to a file to enable sharing of the file manipulation. The compression/decompression block 36 is capable of reading and decompressing the buffer as well as of compressing and writing the data. The buffer manager 35 manages memory buffer recourses.

The compression block further comprises an integrity manager 37 connected with a storage I/O block 38, the session manager, the buffer manager and the file manager. The integrity manager is responsible for synchronization and general control of all processes in the compression system. The storage I/O is interfacing between the compression system and the file system via the interface 22 and is capable of emulating the respective API.

Those skilled in the art will readily appreciate that the invention is not bound by the configuration of FIG. 3; equivalent and/or modified functionality may be consolidated or divided in another manner.

FIG. 4 illustrates a schematic diagram of raw and compressed files in accordance with certain embodiments of the present invention. The uncompressed raw file 41 is segmented into portions of data 43 with substantially equal predefined size (hereinafter referred to as clusters). These clusters serve as atomic elements of compression/decompression operations during input/output transactions on the files. The segmentation of the raw file into clusters may be provided "on-the-fly" during the compression process, wherein each next portion 43 with a predefined size constitutes a cluster that is subjected to compression. In certain other embodiments of the invention, the segmentation may be provided before compression. The size of the last portion of the raw file may be equal or less than the predefined size of the cluster; in both cases this portion is handled as if it has a size of a complete cluster. The size of the clusters may be configurable; larger clusters provide lower processing overhead and higher compression ratio, while smaller clusters provide more efficient access but higher processing overhead. Also, the size of cluster depends on available memory and required performance, as compression/decompression process of each file session requires at least one cluster available in the memory while performance defines a number of simultaneous sessions. The number of clusters is equal to the integer of (size of the raw file divided by the size of cluster) and plus one if there is a remainder.

Alternatively, in certain other embodiments of the invention, the size of cluster may vary in accordance with pre-defined criteria depending, for example, on type of data (e.g. text, image, voice, combined, etc.). For example, each type of data may have predefined size of cluster and the compression system during compression may select the appropriate size of cluster in accordance with data type dominating in the compressing portion of the raw file.

Each intra-file cluster 43 (e.g. 43A-43C as illustrated in FIG. 4) is compressed into respective compressed section 46 (e.g. 46A-46C as illustrated in FIG. 4). The clusters with the same size may naturally result in compressed sections with different size, depending on the nature of data in each cluster and compression algorithms. If a ratio of a cluster compression is less than a pre-defined value, the corresponding compressed section in the compressed file may comprise uncompressed data from this cluster. For instance, if the raw data in a given cluster is compressed to no less than X % (say 95%) of the original cluster size, then due to the negligible compression ratio, the corresponding section would accommodate the raw cluster data instead of the compressed data.

In certain embodiments of the invention, the compression process may include adaptive capabilities, providing optimal compression algorithm for each cluster in accordance with its content (e.g. different compression algorithms best suited for clusters with dominating voice, text, image, etc. data)

In accordance with certain embodiments of the present invention each compressed file 44 comprises a header 45, several compressed sections 46 and a section table 47. The header 45 of the compressed file comprises unique file descriptor, the size of the raw file 41 and a signature indicating whether the file was processed by the compression system 20 (also for files which were not compressed by the compression system, e.g. because of obtainable compression ratio less than a predefined value).

The number of compressed sections within the compressed file is equal to the number of clusters. In accordance with certain embodiments of the present invention, the data in the compressed sections 46 are stored in compression logical units (CLU) 48 all having equal predefined size (e.g., as illustrated in FIG. 4, compression logical units 48A0-48A2 correspond to the compressed section 46A which corresponds to the cluster 43A). This predefined CLU size is configurable; larger CLUs provide lower overhead, while smaller CLUs lead to higher resolution. Also, in certain embodiments of the invention, the CLU size may be adjusted to the maximum and/or optimal CIFS/NFS packet length The number of CLUs within a compressed section is equal to the integer of (size of the compressed section divided by the size of CLU) and plus one if there is a remainder. The last CLU in compressed section may be partly full (as, e.g. 48-A2, 48-C1 in FIG. 4). Such CLUs may be handled in the same manner as full CLUs. In certain embodiments of the invention, the last CLU in the last compressed section (as, e.g., illustrated by 48-C1 in FIG. 4) may be handled in a special manner; namely, to be cut to the exact compression size if partly full (further described with reference to FIG. 9 below).

CLUs may be considered as a virtual portion of the compressed file formed by a virtual sequence of segments in the memory. The relationship between CLUs and assigned memory segments is further described with reference to FIG. 11 below.

The section table 47 comprises records of all compressed sections 46 and specifies where to find CLUs corresponding to each of compressed sections. The record in respect of each compressed section (hereinafter section record) comprises a signature indicating if the section was compressed, overall size of the compressed section and a list of pointers pertaining to all CLUs contained in the section. Optionally the record may comprise indication of compressed algorithm used during compression of the corresponding cluster and size of cluster (if variable per predefined criteria). Preferably, the section table 47 is placed at the end of the compressed file as its length may change when the content of the file is updated (as will be further illustrated, the length of section table is proportional to a number of compressed sections and, accordingly, number of clusters).

FIG. 5 illustrates, by way of non-limiting example, an exemplary structure of section table of an exemplary file.

This exemplary file 50 (referred to also in further examples) has original size 3 MB+413 bit, predefined cluster size 1M and CLU size 60K. Accordingly, the raw file contains 4 clusters (3 clusters of 1 MB and one which is partly full, but handled as complete cluster).

A record 51 of a compressed section comprises a signature 52, size of the section 53 and several entries 54. Each entry 54 of the section record comprises information about one of CLUs contained in the compressed section. The section table comprises relation between the physical location and the logical CLU #.

The clusters of the exemplary file 50 are compressed into compressed sections with respective sizes of, e.g., 301123, 432111, 120423 and 10342 bytes. As CLU length of 60K means 61440 bytes, the section #0 has 5 allocated CLUs ([301123/61440]+1); section #1 has 8 allocated CLUs ([432111/61440]+1); section #2 has 2 allocated CLUs ([120423/61440]+1) and section #3 has 1 allocated CLU ([10342/61440]+1). Totally, the compressed file will comprise 16 CLUs (with total size 15*61440 bytes+10342 bytes), fixed length header (e.g. 24 bytes including 4 byte for the signature, 16 byte for the file ID (unique descriptor) and 4 byte for the info about original size), and section table with 4 section records.

If the exemplary file 50 was created as a new compressed file, the CLUs will be allocated sequentially.

For example, the first 5 CLUs with pointers 1, 2, 3, 4, 5 will be allocated to Section 0;

The next 8 CLUs with pointers 6, 7, 8, 9, 10, 11, 12, 13 will be allocated to Section 1;

The next 2 CLUs with pointers 14, 15 will be allocated to Section 2;

Next 1 CLUs with pointer 16 will be allocated to Section 3.

The distribution of CLUs within the file may be changed after an update (as will be further described with a reference to FIGS. 8-11 below).

For example, the CLUs with pointers 1, 4, 5, 6, 9 will be allocated to Section 0;

The CLUs with pointers 2, 3, 7, 10, 11, 12, 15, 14 will be allocated to Section 1;

The CLUs with pointers 8, 13 will be allocated to Section 2;

CLUs with pointer 16 will be allocated to Section 3.

(In the current example the updates had no impact on the size of the compressed sections).

When a file is created as a new compressed file, the virtual (logical) sequence of CLUs is the same as physical sequence of disk segments corresponding to the CLUs. In an updated file, virtual (logical) sequence of CLUs may differ from the physical sequence of disk segments corresponding to the CLUs. For instance in the example above, the second CLU of the first cluster was initially located at a physical segment #2 wherein after the update it is located at the physical segment #4. Each CLU is assigned to a segment in a memory, the correspondent segment is written in the offset of the header 45 length plus CLU's length multiplied by the segment serial number. For example, in the exemplary file above, when the second CLU of the first cluster is located at the physical segment #2, it is written in the storage location memory in the offset 24 bytes of the header plus 2*61440 bytes. When after an update this CLU is located at the physical segment #4, its offset becomes 24 bytes of the header plus 4*61440 bytes.

In certain embodiments of the invention, the number of entries in each section record is constant and corresponds to the maximal number of CLUs which may be required for storing the cluster. Accordingly the size of each section record is constant regardless of the actual number of CLUs comprised in the section; not in use entries may have special marks. The number of entries in the section records is equal to integer of size of cluster divided by the size of CLU plus one.

In the illustrated example with clusters predefined size 1 MB and CLU's predefined size 60 K, each record of compressed section has 17 entries (integer of 1 MB/60K plus one) each one having 4 bytes. Respectively, the illustrated section record 50 of the compressed section #0 has 5 entries containing information about physical location of the correspondent CLUs and 12 empty entries (marked, e.g. as −1). The size of section record is 72 bytes (4 bytes for info on the compressed section size and signature plus 17 entries*4 bytes). The overall size of the section table is 288 bytes (4 compressed sections*72 bytes for each section record).

In certain embodiments of the invention, the compressed data may be stored separately of the section table 47. The compression system 20 shall be configured in a manner facilitating maintenance of association between the compressed data and the corresponding section tables during read/write operations.

FIGS. 6-11 illustrate input/output operations performed on a compressed file in accordance with certain embodiments of the present invention. Note that the compression system 20 intervenes also in commands referring to the size of a raw file (e.g. DIR, STAT, etc.) keeping the size in the header of correspondent compressed file and providing said data upon request. Thus, for example, consider a file having file size X (in its raw form) and Y (<X) in its compressed form (as stored in the disk). In accordance with the specified characteristics, the file size stored in the header would be X (raw file size) maintaining thus full transparency insofar as system commands such as DIR, STAT are concerned.

Upon interception of API request to open a specific file compressed in accordance with certain embodiments of the present invention (a user may be not aware that the file is compressed), the compression system 20 transfers the request to the file system (emulating request by the API) and receives a "Handle" reply serving as a key for the file management (or "Null" if the file is not found). Following the received "Handle," the compression system 20 reads the header 45 comprising the file ID (unique file descriptor) and the size of corresponding raw file. Per the file ID the compression system 20 checks if there is a concurrent session related to the file. If "No," the compression system generates a File Block comprising a unique file descriptor and the size of raw file. If the file is already in use, the compression system adds additional session to the existing File Block. The "Handle" then is returned to a user to be sent to the compression system following with the requests on file operations.

Open file operation also includes reading the section table 47 of the compressed file and obtaining information of all CLUs corresponding to the file. From the moment the file is opened and until it is closed, the compression system is aware of CLUs structure of the file and offset of any byte within the file.

Figure 6:
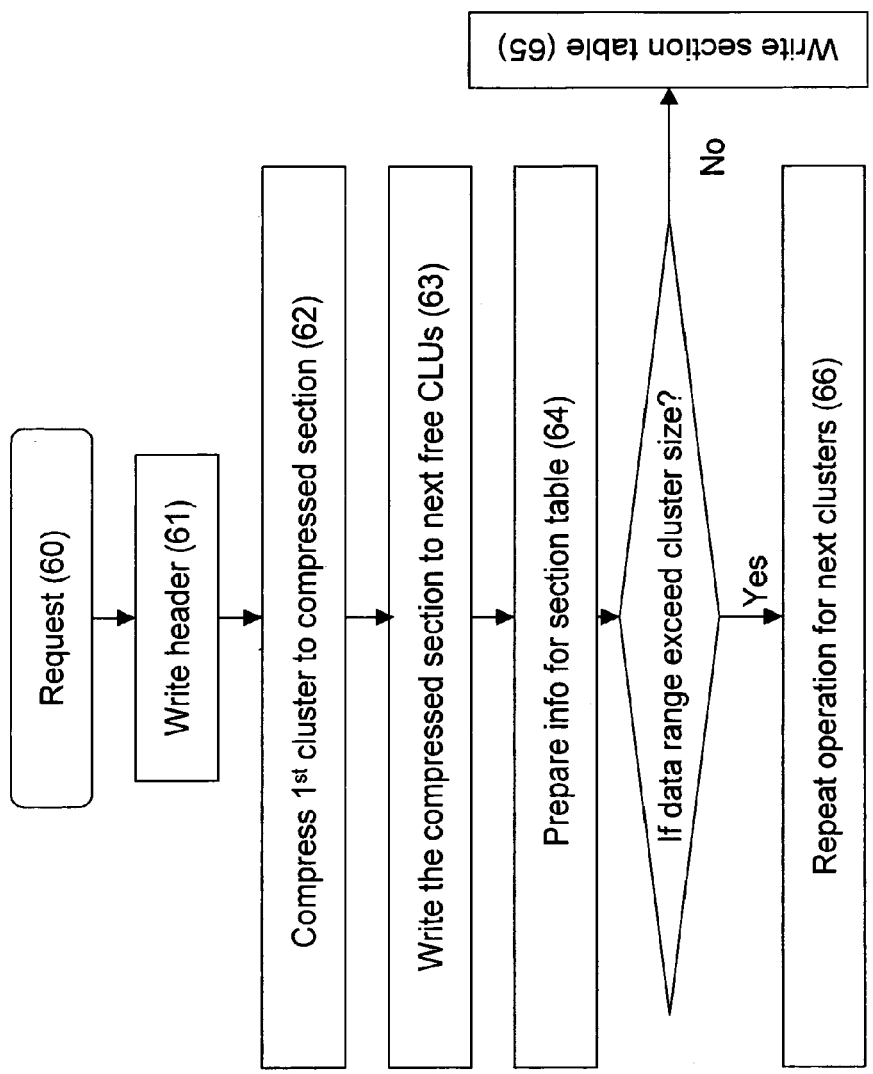
FIG. 6 is a generalized flowchart of operation of compressed file creation in accordance with certain embodiments of the present invention.

Referring to FIG. 6, there is illustrated a generalized flowchart of compressed file creation in accordance with certain embodiments of the present invention. The process is initiated by interception of a "create" request by an API. The compression system 20 generates 60 request to the file system (emulating the request by the API); and after confirmation, initiates writing 61*a* header of the compressed file at the storage unit. As described in FIG. 4, the header will include a file descriptor, a size of the raw uncompressed file and a signature indicating that the file was processed by the compression system 20. At the next step 62 the compression system processes the first fixed-size portion (cluster) of the raw file into compressed section having size X. (The compression may be provided with a help of any appropriate commercial or specialized algorithm). The compression system defines first free storage location for the first CLU, starts and handles continuous writing 63 of the compressed section in this and sequential CLUs for storing at the storage unit, and prepares 64 the pointers of the CLUs occupied during the process to be recorded in the section table. The compression system repeats 65 the process for next clusters until the data of the entire file are written in the compressed form and the section table is created 66. In certain embodiments of the invention, the section table may be stored out of the compressed file.

Figure 7:
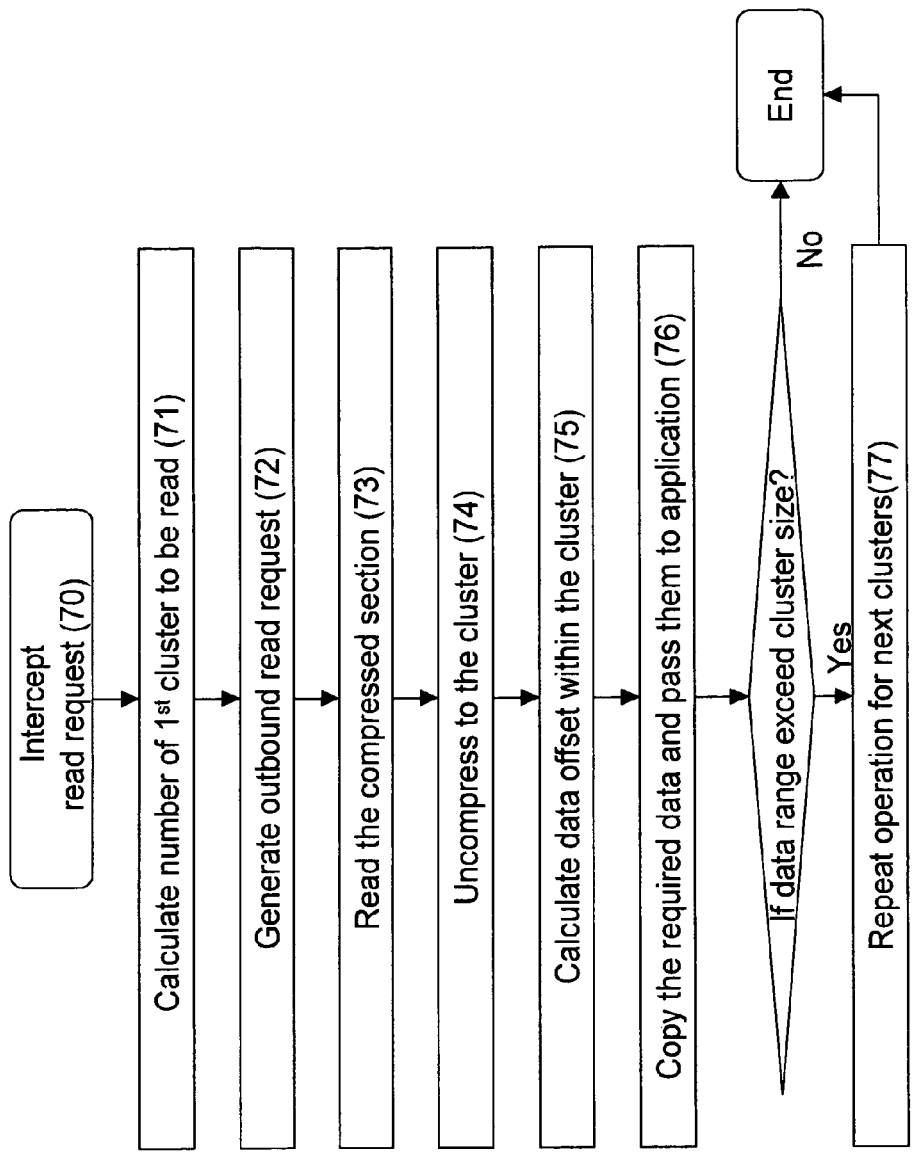
FIG. 7 is a generalized flowchart of read operation on a compressed file in accordance with certain embodiments of the present invention.

Referring to FIG. 7, there is illustrated a generalized flowchart of read operation on a compressed file in accordance with certain embodiments of the present invention.

The read operation starts with interception of a "read" read request 70 by an API comprising input parameters (e.g. File Handle, Seek Number (data offset) and data length Y) and output parameters (e.g. target buffer address). The read request identifies the offset (in raw file) and the range Y of data to read. The compression system 20 calculates 71 the serial number of the $1^{st}$ cluster to be read (hereinafter the starting cluster) as integer of (offset divided by size of the cluster) and plus one if there is a remainder. The number of clusters to be read is defined by integer of (range of data to be read divided by size of the cluster) plus one. As a result, the compression system defines the compressed section(s) with one-to-one correspondence to the clusters to be read and generates read request 72 to the file system. The request is based on meta-data of compressed file (header and section table) pointing to the CLUs corresponding to the compressed section(s) to be read. In certain embodiments of the invention, the offset of the section table placed at the end of compressed file may be easily calculated as following: size of compressed file minus number of clusters multiplied by fixed size of section record.

In other embodiments the compression system may be configured to facilitate association between the compressed data and the corresponding meta-data stored in a separate file.

In certain embodiments of the invention, the read request to the file system may be sent specifying all the range of the data to be read. Alternatively, as illustrated in FIG. 7, the overall read request is handled in steps, and for read operation the compression system maintains a buffer substantially equal to the size of cluster. The first outbound (to the file system) read request comprises pointers to CLUs contained in the compresses section of the starting cluster. The entire compressed section corresponding to the starting cluster is read 73 and then uncompressed 74 by the compression system to the target buffer. At the next step the compression system calculates 75 the required offset within the cluster and copies the required data 76 to be passed to the application. The required length of copying data is calculated as follows: Length=Minimum{data range Y; (cluster size-offset mod cluster size)}

If the data range Y exceeds the cluster size, the operation is repeated 77.

For example, referring to the exemplary file 50, request is to read file data of 20 bytes length from the offset 1 MB+1340. Reading will start from the second cluster and, accordingly, the required data are contained in compressed file starting from $2^{nd}$ compressed section. The offset of the section table is defined as the size of compressed file minus number of clusters (4)*size of section record (72 bytes). The record of the $2_{nd}$ compressed section in the section table contains CLUs with pointers 2, 3, 7, 10, 11, 12, 15, 14. Accordingly, these CLUs will be read to a temporary buffer in the compression system 20 and uncompressed to 1 MB buffer in the compression system. Then 20 bytes from the buffer offset 1340 will be moved to the target (user's) buffer. The required length of copying data is 20 bytes (equal to minimum between 20 bytes and (1 MB-1340 bytes)). If the other request were to read file data of 2 MB length from the same offset, the operation would be repeated in a similar manner to $3^{rd}$ and $4^{th}$ compressed sections; and the required length of data copying from the starting cluster is 1 MB-1340 bytes (equal to minimum between 2 MB and (1 MB-1340 bytes)).

Figure 8:
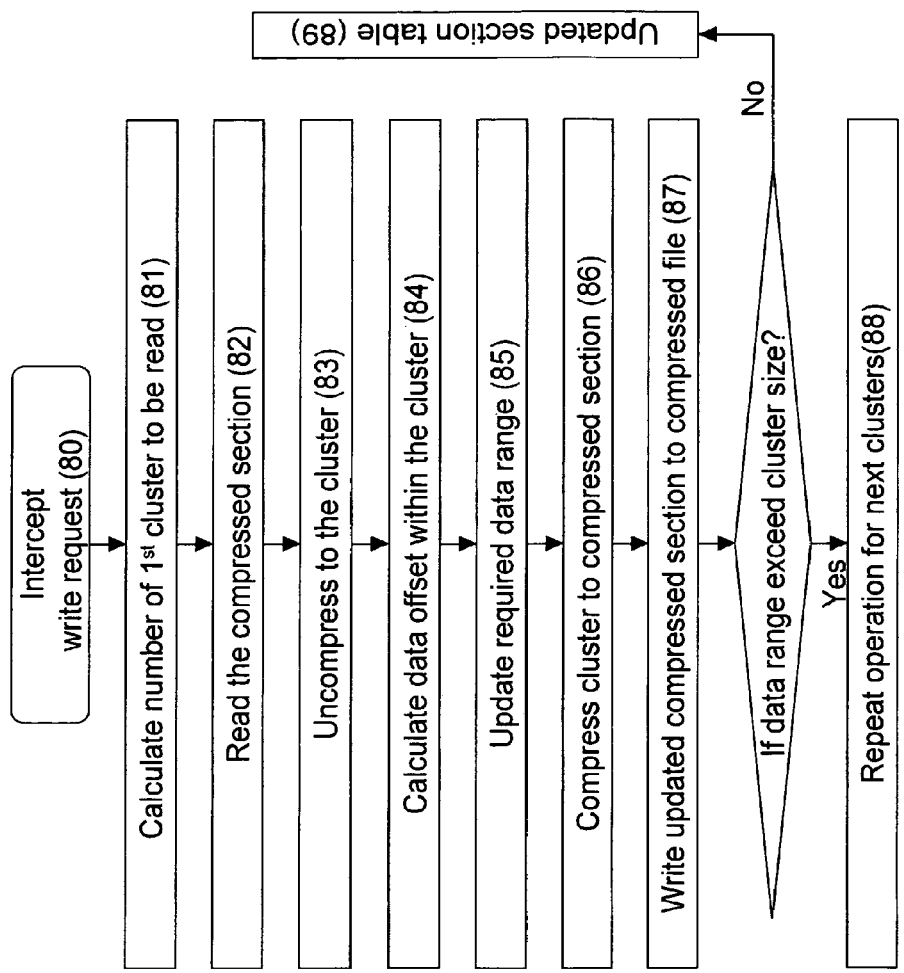
FIG. 8 is a generalized flowchart of write operation on a compressed file in accordance with certain embodiments of the present invention.

Referring to FIG. 8, there is illustrated a generalized flowchart of write operation on a compressed file in accordance with certain embodiments of the present invention. An inbound (intercepted from an API) "write" request 80 identifies the offset (in raw file) and the range Y of data to write. The compression system 20 calculates 81 the serial number of the $1^{st}$ cluster to be updated (overwrite) as integer of (offset divided by size of the cluster) and plus one if there is a remainder. The number of clusters to overwrite is defined by integer of (range of data to write divided by size of the cluster) and plus one if there is a remainder. As a result, the compression system defines the compressed section(s) to overwrite and generates outbound (to the file system) read request in a manner similar to that described with reference to FIG. 7. After the entire compressed section corresponding to the starting cluster is read 82 and then uncompressed 83 by the compression system to the buffer, the compression system calculates 84 the required offset within the cluster as described with reference to FIG. 7 and updates (overwrites) the required data range 85. Then, the compression system compresses 86 the updated cluster, updates the section table and requests to write 87 the new compressed section to the compressed file. If the data range Y exceeds the cluster size, the operation is repeated 88 for successive clusters. Upon the end of the process, the compression system updates the section table 89.

As described above, in certain embodiments of the present invention the storage location of required data may be accessed directly and, accordingly, read/update (and similar) operations require restoring merely the clusters containing the required data range and not the entire files.

Figure 9:
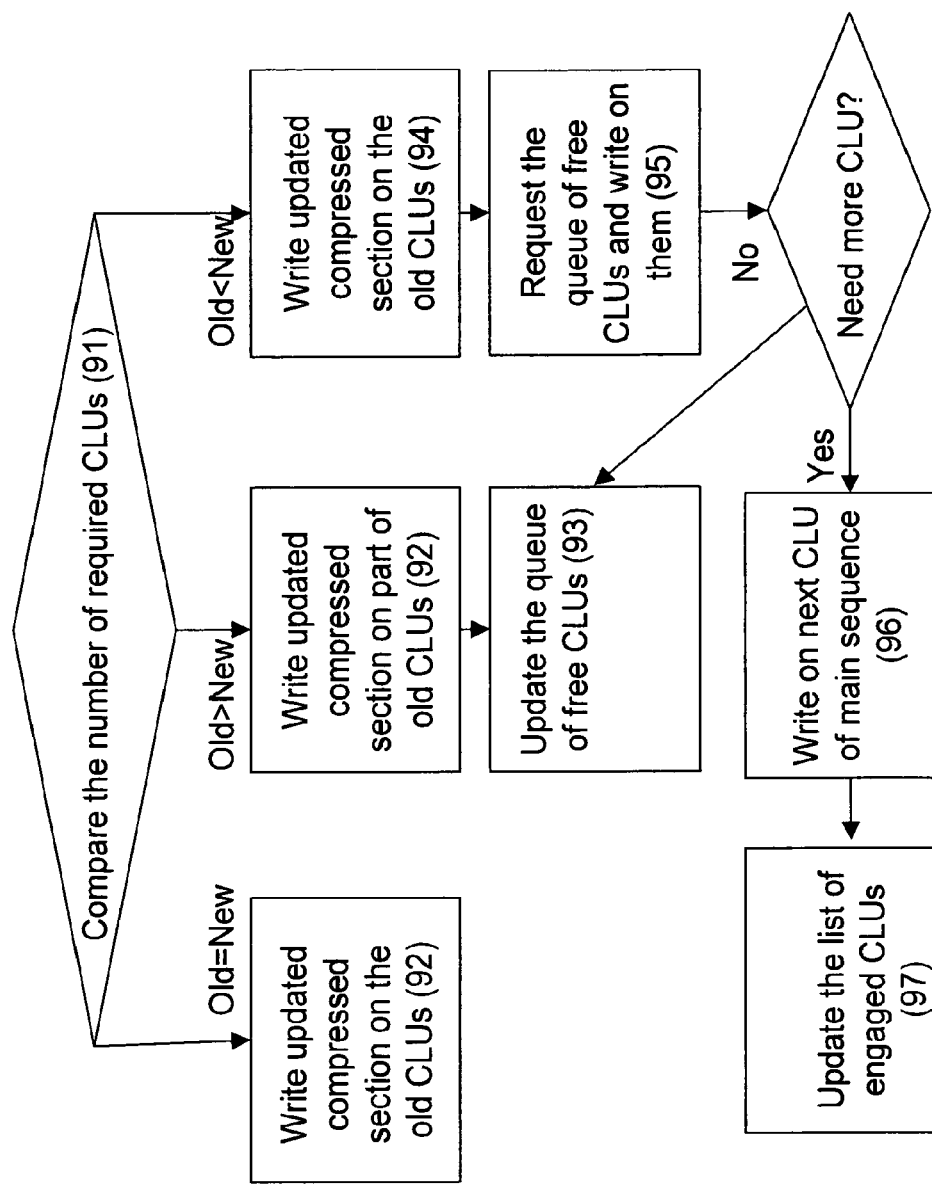
FIG. 9 is a generalized flowchart illustrating sequence of write operation on a compressed section in accordance with certain embodiments of the present invention.
Figure 10:
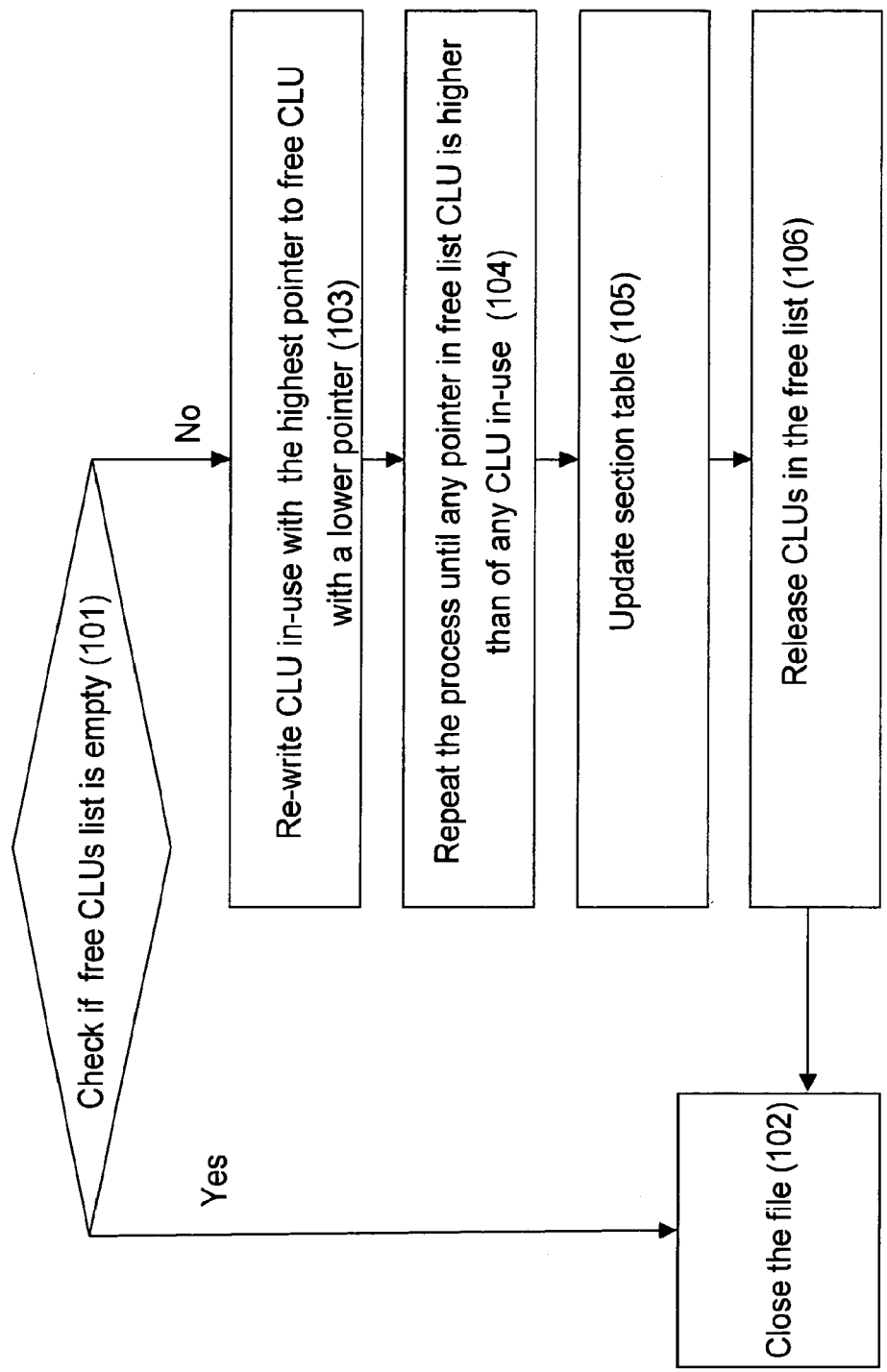
FIG. 10 is a generalized flowchart of CLU management during close operation on a file.

Typically, file updating may cause fragmentation because of unused space aroused in allocated storage. FIGS. 9 and 10 illustrate fragmentation handling algorithms of CLU management in accordance with certain embodiments of the present invention. FIG. 9 illustrates an algorithm of CLU management during write/update operation on a compressed section (step 87 in FIG. 8) in accordance with certain embodiments of the present invention. Before writing the updated compressed section, the compression system compares 91 the number of CLUs required for the updated and old compressed sections. If the number of CLUs is unchanged, the compression system 20 requests to write the updated compressed section sequentially to all CLUs 92 corresponding to the old compressed section. If the new number of the required CLUs is less than the old number, the compressed section will be written sequentially on a part of CLUs corresponding to the old compression section. The information about released CLUs is updated 93 in a special list (queue) of free CLUs handled by compression system 20 until the file is closed. If the new number of the required CLUs is more than the old number, the compressed section will be written sequentially on all CLUs corresponding to the old compression section 94 and then on CLUs taken from the free CLUs queue 95. If still more CLUs are required, the compression system will define the last CLU allocated to the file (#n) and request to write sequentially on CLUs starting with number (n+1) (96); the list of allocated CLUs will be accordingly updated 97.

In certain embodiments of the invention the last CLU in the last compressed section (as illustrated by 48-C1 in FIG. 4) may be handled in a special manner; namely, to be cut to the exact compression size if partly full. The section table will be written on the offset of the header length+(N-1)*CLU size+ $S_L$, where N is a total number of allocated CLUs and $S_L$ is the size of compressed data in the last CLU.

FIG. 10 illustrates an algorithm of CLU management during close operation on a file, in accordance with certain embodiments of the invention.

Before closing 102 the file, the compression system checks 101 if the list of free CLUs is empty. If the list still comprises CLUs, the compression system 20 defines a CLU with the highest storage location pointer among CLUs in-use. Compressed data contained in said CLU are transferred 103 to a free CLU with a lower pointer and the emptied CLU is added to the list of free CLUs. The process is repeated 104 until all the pointers of CLUs in-use are lower than the pointer of any CLU comprising in the list of free CLUs. The section table will be accordingly updated 105. Such updates may occur per each of said CLU re-writing, after the end of entire re-writing process or in accordance with other predefined criteria. At the end of the process the file is closed and free CLUs are released 106. The selection of free CLU for above process may be provided in accordance with different algorithms. For example, in certain embodiments of the invention said compressed data from the CLU with the highest storage location pointer may be transferred to the free CLU with the lowest storage location pointer.

Figure 11A:
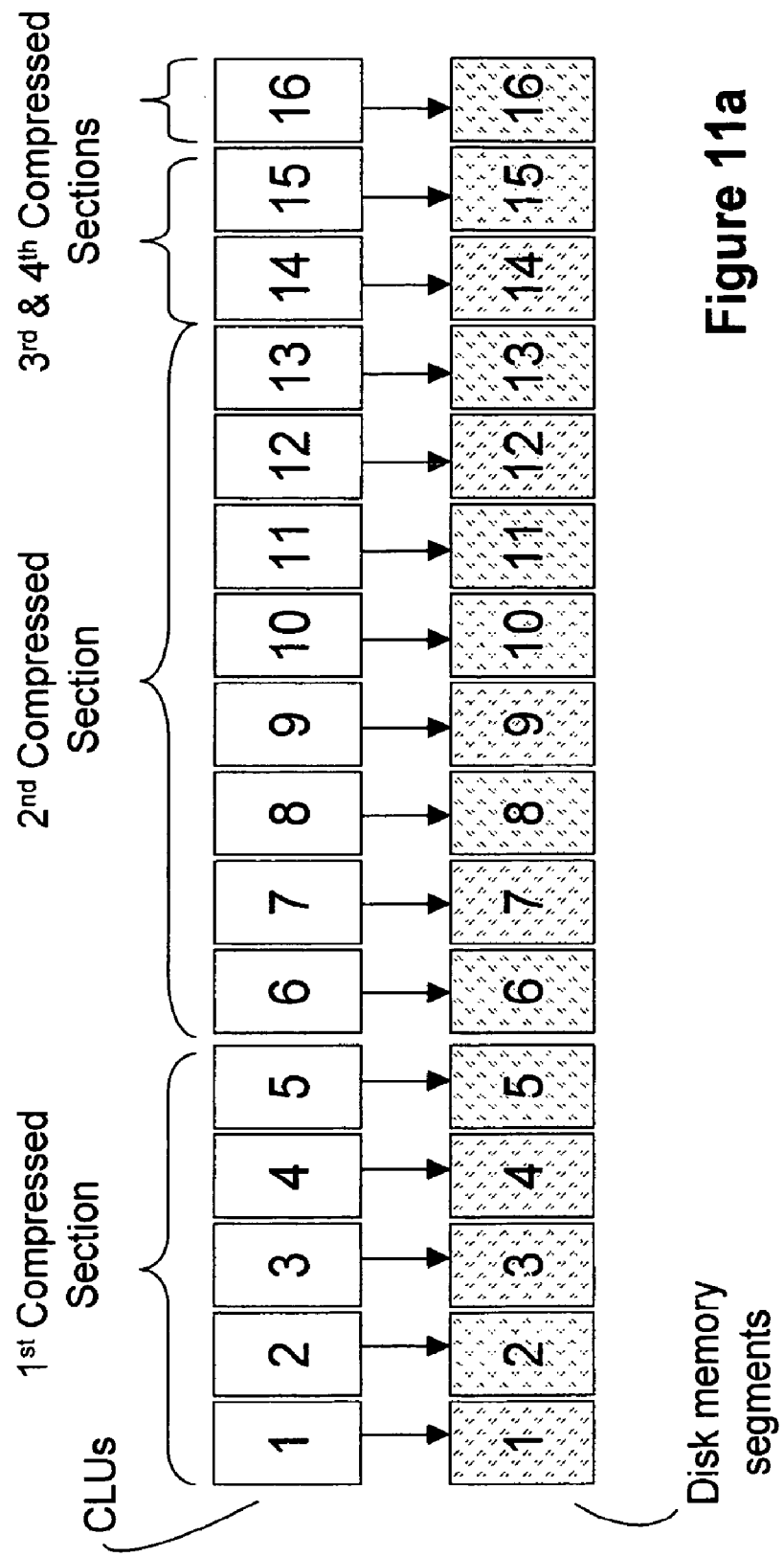
FIGS. 11a-11c are schematic illustrations of relationship between CLUs and assigned disk memory segments in accordance with certain embodiments of the present invention.
Figure 11B:
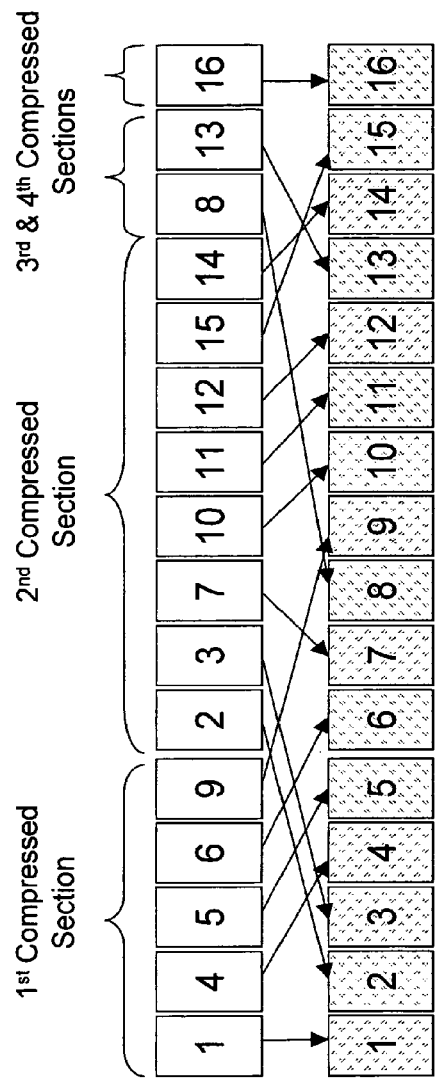
Figure 11C:
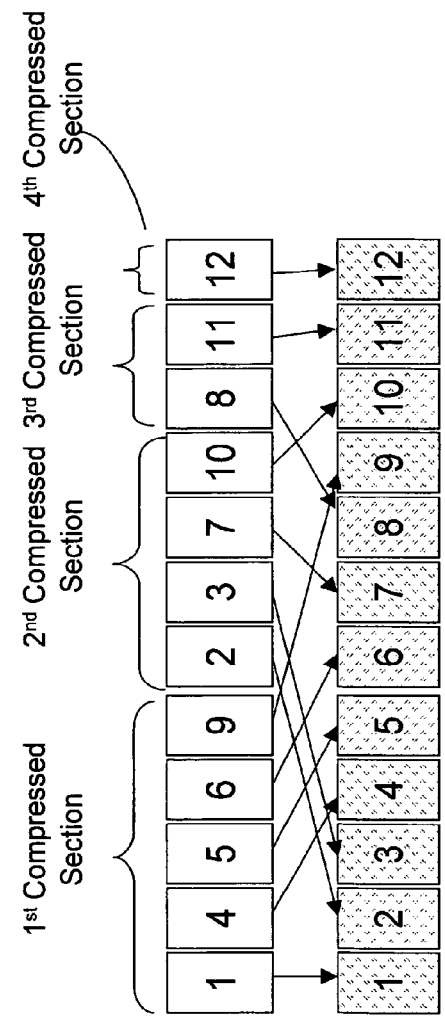

Referring to FIGS. 11a-11c, there are illustrated relationship between CLUs and assigned disk memory segments in accordance with certain embodiments of the present invention. FIG. 11a illustrates exemplary file 50 illustrated in FIG. 5 when created as new compressed file. The virtual (logical) sequence of CLUs is the same as physical sequence of disk segments corresponding to the CLUs (numbers within CLUs are illustrating pointers to the respective disk memory segments). FIG. 11b illustrates the new distribution of CLUs within the updated compressed file with unchanged size of the compressed sections as in the updated exemplary file described with reference to FIG. 5. The virtual (logical) sequence of CLUs differs from the physical sequence of disk segments corresponding to the CLUs whilst maintaining de-fragmented structure of the file. FIG. 11c illustrates the de-fragmented distribution of CLUs within updated exemplary compressed file 50, wherein the size of $2^{nd}$ compressed section has been changed after an update from 432111 to 200100 bytes. If, for example, the update offset is 1 MB+314 bytes, the first compressed section is unaffected during the update. The new size of $2^{nd}$ compressed section requires allocation of only 4 CLUs ([200100/61440]+1). Note, as shown in FIG. 11B, that before the update the second compressed section accommodated 8 CLUs (Nos. 2, 3, 7, 10, 11, 12, 15 and 16). As described with reference to FIG. 9, the compression system 20 will write the updated $2^{nd}$ compressed section on first 4 CLUs from the compressed section (2, 3, 7, 10 in the present example) and send CLUs with pointers 11, 12, 15 and 16 to the list of free CLUs. $3^{rd}$ and $4^{th}$ compressed sections are also unaffected during this particular update. As described with reference to FIG. 10, the compression system 20 before closing the file will check if the list of free CLUs is empty. By this example the list contains CLUs with storage location pointers 11, 12, 15 and 16. As described with reference to FIG. 10, the compression system will re-write compressed data from CLU with pointer 13 to CLU with pointer 11; compressed data from CLU with pointer 16 to CLU with pointer 12 and release CLUs with pointers 13-16. Thus the updated file has 12 allocated CLUs with no de-fragmentation.

Additional requirements (e.g. secure access, data integrity, etc.) may lead to more complicated communication between the compression system and the computer.

It is also to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the present invention.

Those skilled in the art will readily appreciate that various modifications and changes can be applied to the embodiments of the invention as hereinbefore described without departing from its scope, defined in and by the appended claims.

The invention claimed is:

1. For use in a computer system comprising a file system coupled with a storage medium and at least one application program interface (API) configured to communicate with the file system by means of file access-related requests, a method for storing a compressed file comprising:
 a) intercepting at least one of said file access-related requests generated via the API; and
 b) providing at least one of the following with respect to said intercepted request:
  i) deriving and compressing data corresponding to the intercepted file access-related request and facilitating communication with the file system for storing the compressed data at the storage medium as at least one compressed file, and
  ii) facilitating restoring at least part of compressed data corresponding to the intercepted file access-related request and communicating the resulting data through the API, wherein:
 the file access-related request is selected from the group comprising a "create file" request, a "read file" request, and a "write file" request, and
 for the "create file" file access-related request, compressing the derived data corresponding to the intercepted "create file" request comprises:
  sequentially processing at least one fixed-size portion of said derived data (cluster) into corresponding compressed section divided into at least one fixed-size compression logical units (CLU), said compressing giving rise to the compressed file containing compressed sections corresponding to said clusters and a header comprising unique file descriptor, and
  creating a section table with at least one record describing a compressed section, said record holding at least information on CLUs corresponding to the compressed section and storage location pointers pertaining to said CLUs.

2. The method of claim 1, wherein the clusters have a pre-defined equal size.

3. The method of claim 1, wherein a size of a cluster is selected from a list of predefined sizes in accordance with a type of data comprised in the cluster.

4. The method of claim 1, wherein a cluster is processed with a compression algorithm corresponding to a type of data comprised in the cluster.

5. The method of claim 1, wherein the compressed file contains at least one section accommodating non-compressed data from a corresponding cluster.

6. The method of claim 1, wherein the processing of a cluster includes assessment of an obtainable compression ratio and generating the compressed data within the compressed section if said compression ratio meets a predefined criterion.

7. The method of claim 1, wherein the header of the compressed file holds information indicating whether at least one cluster was processed into a compressed section.

8. The method of claim 1, wherein the records describing the compressed sections have an equal pre-defined size.

9. The method of claim 1, wherein a record of a compressed section holds information indicating if the compressed section contains compressed data.

10. The method of claim 1, wherein the data is compressed if the intercepted request fits predefined criteria.

11. The method of claim 1, wherein the section table forms a part of the compressed file.

12. The method of claim 11, wherein the section table is stored at the position following the last compressed section contained in the compressed file.

13. The method of claim 1, wherein the section table forms a part of a file other than the compressed file.

14. The method of claim 1, wherein the size of a last CLU in a last compressed section is defined by an actual size of compressed data stored in said CLU.

15. The method of claim 1, for file access-related request for reading a file stored as compressed data, wherein said compressed data are packed into one or more compressed sections corresponding to fixed-size portions of data (clusters) of the raw file, said compressed sections divided into fixed-size compression logical units (CLU), the method comprising:
   a) determining a serial number of a first compressed section comprising data to be read;
   b) determining the CLUs corresponding to said compressed section and storage location thereof by referring to the section table; and
   c) facilitating restoring the cluster from said compressed section.

16. The method of claim 15, further comprising repeating the stages b) and c) for compressed sections with serial numbers incremented by 1 if the range of data to be read exceeds the size of the restored clusters, until all data to be read are restored.

17. The method of claim 1, for file access-related request for writing data at a given data range to a file stored as compressed data, wherein said compressed data are packed into one or more compressed sections corresponding to fixed-size portions of data (clusters) from the raw file, said compressed sections divided into fixed-size compression logical units (CLU), the method comprising:
   a) determining a serial number of first compressed section comprising data to be updated constituting the original compressed section;
   b) determining the storage location of the compressed data to be updated by referring to a section table which holds information on CLUs corresponding to said compressed section and storage location thereof;
   c) facilitating restoring the cluster from said original compressed section;
   d) calculating the offset of updating data within said cluster and facilitating the update of the given data range;
   e) compressing the updated cluster into an updated compressed section;
   f) facilitating overwriting of said original compressed section with updated compressed section; and
   g) updating the section table.

18. The method of claim 17, further comprising repeating stages b) through g) for compressed sections with serial numbers incremented by 1 if the range of data to be write exceeds the size of the restored clusters, until all required data are written.

19. The method of claim 17, further comprising handling a list of free CLUs released during writing data to the compressed file, said list is handled during all sessions related to the file until the file is closed.

20. The method of claim 19, further comprising comparing the number of CLUs required to said original $N_o$ and said updated $N_u$ compressed sections and facilitating one of the following:
   a) overwriting all CLUs corresponding to the original compressed section with CLUs corresponding to the updated compressed section if $N_o = N_u$;
   b) overwriting first $N_u$ CLUs corresponding to the original compressed section with CLUs corresponding to the updated compressed section and updating the list of free CLUs about released CLUs if $N_o > N_u$;
   c) overwriting all CLUs corresponding to the original compressed section with CLUs corresponding to the updated compressed section and writing the rest of CLUs corresponding to the updated compressed section to the CLUs contained in the list of free CLUs, if $N_o < N_u \leq N_o + N_f$, where $N_f$ is a number of CLUs in said list; and
   d) overwriting all CLUs corresponding to the original compressed section with CLUs corresponding to the updated compressed section, writing the CLUs corresponding to the updated compressed section to the CLUs contained in the list of free CLUs, and continuous writing the rest of CLUs corresponding to the updated compressed section to next free storage location if $N_o + N_f < N_u$.

21. The method of claim 19, further comprising:
   a) checking the list of free CLUs before closing the file;
   b) if said list is not empty defining a CLU with the highest storage location pointer among CLUs comprised in the compressed sections (first CLU);
   c) facilitating moving the compressed data from said first CLU to a free CLU with lower storage location pointer (second CLU);
   d) assigning said second CLU to pertaining compressed section and said first CLU to the list of free CLUs;
   e) repeating the stages b)-d) until the storage location pointers of all CLUs comprised in compressed sections are lower than a pointer of any of CLU comprising in the list of free CLUs; and
   f) updating the section table.

22. The method of claim 1, further comprising maintaining a de-fragmented structure of the compressed file.

23. The method of claim 1, wherein the computer system comprises more than one computer platform.

24. A computer system configured for operating with compressed files, the system comprising:
   a) a file system coupled to a storage medium and to at least one application program interface (API) configured to communicate with the file system by means of file access-related requests;
   b) an intercepting subsystem capable of intercepting at least one of said file access-related requests generated via the API; and
   c) a compression subsystem configured to provide at least one of the following with respect to said intercepted request:
      i) deriving and compressing data corresponding to the intercepted file access request and facilitating communicating with the file system for storing the compressed data at the storage medium as a at least one compressed file, and
      ii) facilitating restoring at least part of compressed data corresponding to the intercepted file access-related request and communicating the resulting data through the API, wherein:
      the file access-related request is selected from the group comprising a "create file" request, a "read file" request, and a "write file" request, and
      for the "create file" file access-related request, compressing the derived data corresponding to the intercepted "create file" request comprises:

sequentially processing at least one fixed-size portion of said derived data (cluster) into corresponding compressed section divided into at least one fixed-size compression logical units (CLU), said compressing giving rise to the compressed file containing compressed sections corresponding to said clusters and a header comprising unique file descriptor, and creating a section table with at least one record describing a compressed section, said record holding at least information on CLUs corresponding to the compressed section and storage location pointers pertaining to said CLUs.

25. The computer system of claim 24, further comprising more than one computer platform, wherein at least two elements selected from the group comprising the file system, the storage medium, the application program interface (API), the intercepting subsystem and the compression subsystem, are accommodated within different computer platforms.

26. The computer system of claim 25, wherein the intercepting subsystem and the compression subsystem are accommodated within different computer platforms.

27. For use in a computer system comprising a file system coupled with a storage medium and at least one application program interface (API) configured to communicate with the file system by means of file access-related requests, a program storage device readable by machine, tangibly embodying a program of instructions executable by the machine to perform method steps for storing a compressed file comprising:

a) intercepting, via an intercepting subsystem, at least one of said file access-related requests generated via the API; and
   b) providing, via a compression subsystem, at least one of the following with respect to said intercepted request:
      i) deriving and compressing data corresponding to the intercepted file access-related request and facilitating communication with the file system for storing the compressed data at the storage medium as at least one compressed file, and
      ii) facilitating restoring at least part of compressed data corresponding to the intercepted file access-related request and communicating the resulting data through the API, wherein:
   the file access-related request is selected from the group comprising a "create file" request, a "read file" request, and a "write file" request, and
   for the "create file" file access-related request, compressing the derived data corresponding to the intercepted "create file" request comprises:
      sequentially processing at least one fixed-size portion of said derived data (cluster) into corresponding compressed section divided into at least one fixed-size compression logical units (CLU), said compressing giving rise to the compressed file containing compressed sections corresponding to said clusters and a header comprising unique file descriptor, and
      creating a section table with at least one record describing a compressed section, said record holding at least information on CLUs corresponding to the compressed section and storage location pointers pertaining to said CLUs.

28. For use in a computer system comprising a file system coupled to a storage medium and at least one application program interface (API) configured to communicate with the file system by means of file access-related requests, a computer program product comprising a computer useable medium having computer readable program code embodied therein for storing a compressed file the computer program product comprising:

a) computer readable program code for causing an intercepting subsystem to intercept at least one of said file access-related requests generated via the API; and
   b) computer readable program code for causing a compression subsystem to provide at least one of the following with respect to said intercepted request:
      i) computer readable program code for causing the computer to derive and compress data corresponding to the intercepted file access-related request and facilitating communication with the file system for storing the compressed data at the storage medium as at least one compressed file, and
      ii) computer readable program code for causing the computer to facilitate restoring at least part of the compressed data corresponding to the intercepted file access-related request and communicating the resulting data through the API, wherein:
   the file access-related request is selected from the group comprising a "create file" request, a "read file" request, and a "write file" request, and
   for the "create file" file access-related request, compressing the derived data corresponding to the intercepted "create file" request comprises:
      sequentially processing at least one fixed-size portion of said derived data (cluster) into corresponding compressed section divided into at least one fixed-size compression logical units (CLU), said compressing giving rise to the compressed file containing compressed sections corresponding to said clusters and a header comprising unique file descriptor, and
      creating a section table with at least one record describing a compressed section, said record holding at least information on CLUs corresponding to the compressed section and storage location pointers pertaining to said CLUs.

* * * * *